US008703073B2

(12) United States Patent
Gracias et al.

(10) Patent No.: US 8,703,073 B2
(45) Date of Patent: Apr. 22, 2014

(54) RECONFIGURABLE LITHOGRAPHIC STRUCTURES

(75) Inventors: David Hugo Gracias, Baltimore, MD (US); Timothy Gar-Ming Leong, Baltimore, MD (US)

(73) Assignee: The Johns Hopkins University, Baltimore, MD (US)

( * ) Notice: Subject to any disclaimer, the term of this patent is extended or adjusted under 35 U.S.C. 154(b) by 576 days.

(21) Appl. No.: 12/864,942

(22) PCT Filed: Mar. 6, 2009

(86) PCT No.: PCT/US2009/036391
§ 371 (c)(1),
(2), (4) Date: Jul. 28, 2010

(87) PCT Pub. No.: WO2009/111737
PCT Pub. Date: Sep. 11, 2009

(65) Prior Publication Data
US 2010/0326071 A1 Dec. 30, 2010

Related U.S. Application Data

(60) Provisional application No. 61/068,344, filed on Mar. 6, 2008.

(51) Int. Cl.
*G01N 15/06* (2006.01)

(52) U.S. Cl.
USPC ............. 422/550; 422/547; 436/43; 977/700; 977/701; 977/707; 977/724; 977/904; 977/906; 977/962

(58) Field of Classification Search
USPC ............. 422/547, 550; 436/43; 977/700, 701, 977/707, 724, 904, 906, 962
See application file for complete search history.

(56) References Cited

U.S. PATENT DOCUMENTS 7,052,616 B2  5/2006  Fonash et al.
2007/0020310 A1  1/2007  Gracias et al.

OTHER PUBLICATIONS

Abermann R, et al., (1984) Internal stress and structure of evaporated chromium and MgF2 Films and their dependence on substrate temperature. *Thin Solid Films* vol. 115, pp. 185-194.
Abermann, R. paper presented at the Materials Research Society, Boston, MA, USA, Dec. 2-5, 1991.
Andersen, K. N. et al., P. Microelectron. Eng. 2008, vol. 85 (5-6), pp. 1128-1130.
Arora WJ, et al., (2006) Membrane folding to achieve three-dimensional nanostructures: Nanopatterned silicon nitride folded with stressed chromium hinges. *Appl. Phys. Lett.* vol. 88, pp. 0531081-0531083.

(Continued)

*Primary Examiner* — Brian J Sines
(74) *Attorney, Agent, or Firm* — Venable LLP; Henry J. Daley; F. Brock Riggs

(57) ABSTRACT

A lithographically structured device has an actuation layer and a control layer operatively connected to the actuation layer. The actuation layer includes a stress layer and a neutral layer that is constructed of materials and with a structure such that it stores torsional energy upon being constructed. The control layer is constructed to maintain the actuation layer substantially in a first configuration in a local environmental condition and is responsive to a change in the local environmental condition such that it permits a release of stored torsional energy to cause a change in a structural configuration of the lithographically structured device to a second configuration, the control layer thereby providing a trigger mechanism. The lithographically structured device has a maximum dimension that is less than about 10 mm when it is in the second configuration.

21 Claims, 13 Drawing Sheets

(56) References Cited

OTHER PUBLICATIONS

Bassik NB, et al., (2008) Patterning thin film mechanical properties to drive assembly of complex 3D structures. *Adv. Mater.* in press (DOI: 10.1002/adma.200801759) pp. 4760-4764 and pp. 1-4.
Bassik, N. et al., "Solvent Driven Motion of Lithographically Fabricated Gels" Langmuir 2008, vol. 24 (21), pp. 12158-12163.
Boncheva, M. et al, "Templated Self-Assembly: Formation of Folded structures by Relaxation of Pre-stressed, Planar tapes**" *Adv. Mater.* 2005, vol. 17, pp. 553-557.
Buckley PR, et al. (2006) Inductively heated shape memory polymer for the magnetic actuation of medical devices. *IEEE T. Biomed. Eng.* vol. 53, pp. 2075-2083.
Cecil J. et al., Int. J. Prod. Res. 2005, vol. 43, pp. 819-828.
Cecil, J. et al., Com-int. Manuf. vol. 23, pp. 580 (Oct. 2007).
Chavez, K. L. et al., J. Electrochem. Soc. 2001, vol. 148 (11), pp. G640-G643.
Chavez, K. L.et al., W. *J. Electrochem. Soc.* 2003, vol. 150 (4), pp. G284-G291.
Chua CL, et al, (2003) Out-of-plane high-Q inductors on low-resistance silicon. *J. Microelectromech. S.* vol. 12, pp. 989-995.
Cybulski, "Modeling and Fabrication of Self-Assembling Micron-Scale Rollup Structures", Massachusetts Institute of Technology, Master's Thesis published May 2004, paar 2, 4, Table 2.1.
Doerner MF, et al., (1988) Stresses and deformation processes in thin films on substrates. *CRC. CR. Rev. Sol. State.* vol. 14, pp. 225-268.
Du, T. et al., V. Electrochim. Acta 2004, vol. 49 (25), pp. 4505-4512.
Flatt, AE (2002) Our thumbs. *Proc. (Bayl. Univ. Med. Cent.)* vol. 15, pp. 380-387.
Gimi B, et al. (2005) Self-assembled three dimensional radio frequency (RF) shielded containers for cell encapsulation. *Biomed. Microdev.* vol. 7, pp. 341-345.
Gogolides E, et al., (1996) Thermal and mechanical analysis of photoresist and silylated photoresist films: Application to AZ 5214™. *Microelectron. Eng.* vol. 30, pp. 267-270.
Guan, J. et al., J. Phys. Chem. B 2005, vol. 109 (49), pp. 23134-23137.
Hoffman RW, et al., (1954) The cause of stress in evaporated metal films. *Proc. Phys. Soc. London, Sec. B* vol. 67, pp. 497-500.
International Search Report and Written Opinion for International Application No. PCT/US09/036391, Filed Mar. 6, 2009.
Jager EWH, et al., (2000) Microrobots for micrometer-size objects in aqueous media: Potential tools for single-cell manipulation. *Science* vol. 288 pp. 2335-2338.
Jager, E. W. H. *Science* 2000, vol. 290, pp. 1540-1545.
Jamani KD, et al., (1989) Rigidity of elastomeric impression materials. *J. Oral Rehab.* vol. 16, pp. 241-248.
Kawata, S. et al., "*Nature*", 2001, vol. 412, pp. 697-698.
Kim, C. J. et al., paper presented at the IEEE Solid-State Sensor and Actuator Workshop, 4th Technical Digest, Hilton Head Island, SC, USA 1990.
Kim, CJ, et al, MG (1992) Polysilicon microgripper. *Sensor. Actuat. A-Phys.* vol. 33, pp. 221-227.
Klokholm E, et al., (1968) Intrinsic stress in evaporated metal films. *J. Electrochem. Soc.* vol. 115, pp. 823-826.
Klokholm, E. et al, *J. Vac. Sci. Technol.* 1969, vol. 6, pp. 138-140.
Lee A.P., et al. (1996) A practical microgripper by fine alignment, eutectic bonding and SMA actuation. *Sensor. Actuat. A-Phys.* vol. 54, pp. 755-759.
Leong TG, et al., (2008) Thin film stress-driven self-folding of microstructured containers. *Small* vol. 4, pp. 1605-1609.
Leong, T. et al., "Spatially Controlled Chemistry Using Remotely Guided nanoliter Scale Containers" *J. Am. Chem. Soc.* 2006, vol. 128, pp. 11336-11337.
Leong, T. et al., "Directing Surface Forces to Construct Large Numbers of small, Patterned Polyhedra" *Langmuir* 2007, vol. 23, pp. 8747-8751.
Lu, YW, et al., (2006) Microhand for biological applications. *Appl. Phys. Lett.* vol. 89, pp. 1641011-1641013.
Luo, et al., "Fabrication and characterization of diamond-like carbon/Ni bimorph normally closed microcages" *J. Micromech. Microeng.* 2005, vol. 15, pp. 1406-1413.
Luo, JK, et al. (2006) Modelling and fabrication of low operation temperature microcages with a polymer/metal/DLC trilayer structure. *Sensor. Actuat. A-Phys.* vol. 132, pp. 346-353.
Madden, JD, et al., Mobile robots: Motor challenges and materials solutions. *Science* vol. 318: pp. 1094-1097 (2007).
Miki, N. et al., "A Spearing", *Sens. Actuators*, 2003, vol. 103, pp. 194-201.
Moiseeva E, et al., (2007) Single-mask microfabrication of three-dimensional objects from strained bimorphs. *J. Micromech. Microeng.* vol. 17, pp. N63-N68.
Morton SL, et al., (1999) Ultrasonic sensor for photoresist process monitoring. *IEEE T.Semiconduct. M.* vol. 12, pp. 332-339.
Nikishkov GP (2003) Curvature estimation for multilayer hinged structures with initial strains. *J. Appl. Phys.* vol. 94, pp. 5333-5336.
Paniez PJ, et al., (1993) Thermal properties of state of the art novolak-diazonaphtoquinone systems: Differences between bulk and film properties. *Proc. SPIE* 1925: pp. 614-625.
Pister, KSJ, et al., (1992) Microfabricated hinges. *Sensor. Actuat. A-Phys.* vol. 33, pp. 249-256.
Prinz, V. Ya.et al, A. K. Microelectron. Eng. 1996, vol. 30, pp. 439-442.
Qi Zq, et al., (2005) Mechanical and tribological behavior of nanocomposite multilayered Cr/a-C thin films. *Thin Solid Films* vol. 479, pp. 174-181.
Randall, et al., "3D lithographically fabricated nanoliter containers for drug delivery" Advanced Drug Delivery Reviews. vol. 59 (2007) pp. 1547-1561, published online Sep. 4, 2007, pp. 1550, para 5; pp. 1552, para 1; pp. 1553, paras 4-5; pp. 1557, para 2; pp. 1558, para 4; Fig. 6; Fig. 12.
Cecily J. et al. *Robot Com-int. Manuf.* vol. 23, pp. 580-588.
Romankiw, L. T. *Electrochim. Acta* 1997, 42, 2985-3005.
Schmidt OG, et al., (2001) Thin solid films roll up into nanotubes. *Nature* vol. 410, pp. 168.
Schmidt, Q. G. et al., *Nature* 2001, vol. 412, pp. 42.
Shalinpoor M, et al., (1998) Ionic polymer-metal composites (IPMCs) as biomimetic sensors, actuators and artificial muscles—a review. *Smart Mater. Struct.* vol. 7, pp. R15-R30.
Small W, et al. (2007) Prototype fabrication and preliminary in vitro testing of a shape memory endovascular thrombectomy device. *IEEE T. Biomed. Eng.* vol. 54, pp. 1657-1666.
Suzuki, K.et al., *Microelectromech. Syst.* 1994, vol. 3, pp. 4-9.
Suzuki, Z. et al., *Microsyst. Technol.* 2007, vol. 13, pp. 1047-1053.
Syms, R. R. A. et al., *J. Microelectromech. Syst.* 2003, vol. 12, pp. 387-417.
Thornton, et al., "Stress-Related Effects in thin films" *Thin Solid Filmss* 1989, vol. 171, pp. 5-31.
Weber, L. et al., presented at Micromachining and Microfabrication Process Technology II, Austin, TX, USA, Oct. 1996.
Whitesides, et al., "Self-Assembly at All Scales" *Science* 2002, vol. 295, pp. 2418-2421.
Ye, et al. (2007) "Remote radio-frequency controlled nanoliter chemistry and chemical delivery on substrates". *Angew. Chem. Int. Edit.* vol. 46, pp. 4991-4994.
Yeh, et al., "Surface-Micromachined Components for Articulated Microrobots" Microelectromech. Syst. 1996, vol. 5, pp. 10-17 (Mar. 1996).
Zhang, L. et al., The Biocompatibility Study of $Fe_3O_4$ Magnetic Nanoparticles Used in Tumor Hyperthermia, presented at IEEE Nano/Micro Engineered and Molecular Systems, Zhuhai, China, Jan. 2006, pp. 339-342.
International Search Report of PCT/US09/36391.
Li Zhang, et al., Fabrication and Characterization of Self-scrolling Si/Cr Micro-and Nanostructures, Proceedings of the 1st IEEE International Conference on Nano/Micro Engineered and Molecular Systems, Zhuhai, China, Jan. 18-21, 2006.

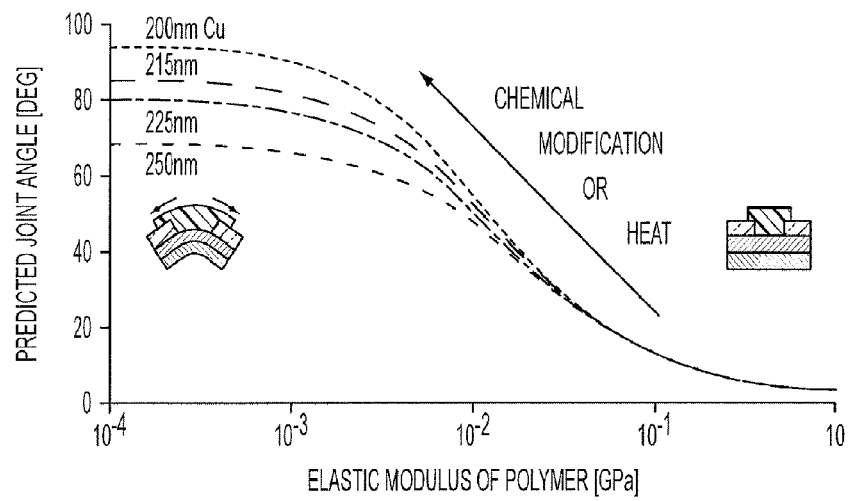
FIG. 9
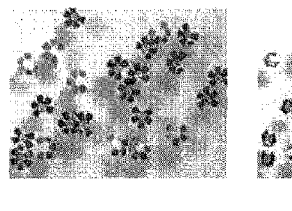 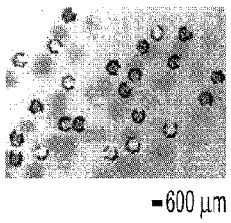  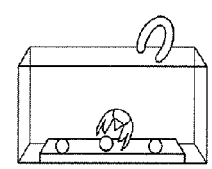
FIG. 10A　　FIG. 10B　　FIG. 10C　　FIG. 10D
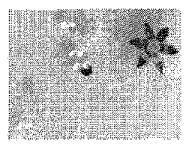 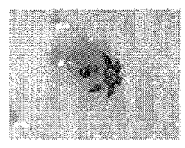 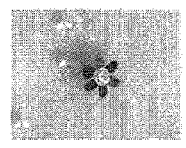 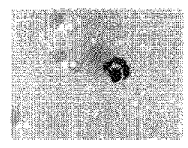 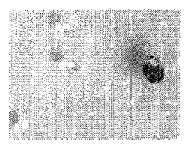
FIG. 10E　FIG. 10F　FIG. 10G　FIG. 10H　FIG. 10I

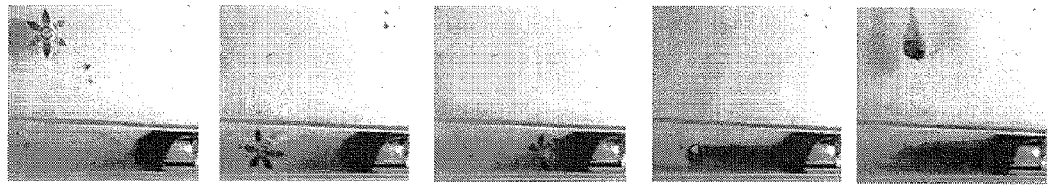

FIG. 11A    FIG. 11B    FIG. 11C    FIG. 11D    FIG. 11E

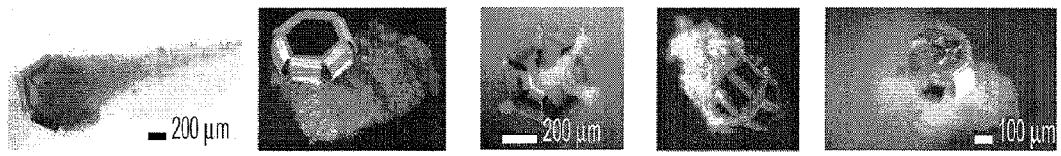

FIG. 11F    FIG. 11G    FIG. 11H    FIG. 11I    FIG. 11J

FIG. 11K

TABLE S1. BIOCHEMICALS COMMONLY USED WITH BIOLOGICAL EXPERIMENTS, TESTED FOR BIOCHEMICAL TRIGGERING OF THE MICROGRIPPERS

| CHEMICAL | BIOCHEMICAL ACTUATION | |
|---|---|---|
| | 25 °C (ROOM TEMPERATURE) | 37 °C (BODY TEMPERATURE) |
| PBS | NONE | PARTIAL |
| NONESSENTIAL AMINO ACIDS | NONE | NONE |
| VENTRICULAR MYOCYTE MEDIA | NONE | COMPLETE |
| L-GLUTAMINE (2mM) | PARTIAL | COMPLETE |
| L929 MEDIA | PARTIAL | COMPLETE |
| MINIMUM ESSENTIAL MEDIA | PARTIAL | COMPLETE |
| GLUCOSE (2.43 M) | PARTIAL | COMPLETE |
| TRYPSIN | PARTIAL | COMPLETE |
| SODIUM PYRUVATE | NONE | PARTIAL |
| HEPES | PARTIAL | PARTIAL |
| ASCORBIC ACID (18.2 mM) | NONE | PARTIAL |

RECONFIGURABLE LITHOGRAPHIC STRUCTURES

CROSS-REFERENCE OF RELATED APPLICATION

This application is a National Stage Application of International Application No. PCT/US2009/036391, filed Mar. 6, 2009, and which claims priority to U.S. Provisional Application No. 61/068,344 filed Mar. 6, 2008, the entire content of both of which are hereby incorporated by reference.

The U.S. Government has a paid-up license in this invention and the right in limited circumstances to require the patent owner to license others on reasonable terms as provided for by the terms of Grant No. Career-DMMI 044816 and DMR05-20491, awarded by the National Science Foundation, and of Grant No. 1R21EB007487-01A1, awarded by the National Institutes of Health.

BACKGROUND

1. Field of Invention

The current invention relates to lithographically produced structures, and more particularly to reconfigurable lithographically produced structures.

2. Discussion of Related Art

Lithography, the workhorse of the microelectronics industry, is routinely used to fabricate micro and nanostructures in a highly monodisperse manner, with high accuracy and precision. However, one of the central limitations of this technology is that it is inherently two-dimensional (2D) as a result of the wafer based fabrication paradigm. It is extremely challenging to fabricate three-dimensional (3D) patterned structures, let alone complex structures containing encapsulated objects, on the sub-mm scale. Thus, the parallel fabrication of such structures remains a major challenge that needs to be addressed.

Some solutions have emerged that enable sub-mm scale lithographic fabrication in 3D; these include techniques such as wafer stacking (N. Miki, X. Zhang, R. Khanna, A. A. Ayon, D. Ward, S. M. Spearing, Sens. Actuators, A 2003, 103, 194-201), micromachining (S. Kawata, H. B. Sun, T. Tanaka, K. Takada, Nature 2001, 412, 697-698), molding (L. T. Romankiw, Electrochim. Acta 1997, 42, 2985-3005; L. Weber, W. Ehrfeld, H. Freimuth, M. Lacher, H. Lehr, B. Pech, presented at Micromachining and Microfabrication Process Technology II, Austin, Tex., USA, October 1996), and self-assembly (G. M. Whitesides, B. Grzybowski, Science 2002, 295, 2418-2421). Self-assembly, or self-folding, of 2D lithographically patterned templates is one attractive strategy for fabricating 3D patterned, sub-mm scale structures. There are numerous methods that enable self-folding, such as surface tension-based assembly (R. R. A, Syms, E. Yeatman, V. M. Bright, G. M. Whitesides, J. Microelectromech. Syst. 2003, 12, 387-417; T. G. Leong, P. A. Lester, T. L. Koh, E. K. Call, D. H. Gracias, Langmuir 2007, 23, 8747-8751), electroactive polymer actuation (E. W. H. Jager, E. Smela, O. Inganas, Science 2000, 290, 1540-1545), electric actuation (K. Suzuki, I. Shimoyama, H. Miura, J. Microelectromech. Syst. 1994, 3, 4-9; K. Suzuki, H. Yamada, H. Miura, H, Takanobu, Microsyst. Technol. 2007, 13, 1047-1053), thermal and shape memory alloy actuation (J. K. Luo, J, H, He, Y. Q. Fu, A, J. Hewitt, S. M. Spearing, N. A. Fleck, W. I. Milne, J. Micromech. Microeng. 2005, 15, 1406-1413; J. K. Luo, R. Huang, J. H. He, Y. Q. Fu, A. J. Flewitt, S. M. Spearing, N. A. Fleck, W. I. Milne, Sens. Actuators, A 2006, 132, 346-353; A. P. Lee, D. R. Ciarlo, P. A. Krulevitch, S. Lehew, J. Trevino, M. A. Northrup, Sens. Actuators, A 1996, 54, 755-759), and stress-driven actuation (W. J. Arora, A. J. Nichol, H. I. Smith, G. Barbastathis, Appl. Phys. Lett. 2006, 88, 053108; C. L. Chua, D. K. Fork, K. Van Schuylenbergh, J.-P. Lu, J. Microelectromech. Syst. 2003, 12, 989-995; E. Moiseeva, Y. M. Senousy, S. McNamara, C. K. Harnett, J. Micromech. Microeng. 2007, 17, N63-N68; O. G. Schmidt, K. Eberl, Nature 2001, 410, 168). However, most previous demonstrations of lithographically patterned, self-folding microstructures are assembled tethered to substrates. Additional limitations include high temperature assembly incompatible with aqueous media or spontaneous assembly once the underlying support layer is dissolved. Thus, versatile on-demand encapsulation of objects within self-assembled structures remains even more of a challenge and has not been previously demonstrated.

Our research group has demonstrated a process that utilized an electrodeposited solder as a hinge for the self-assembly of lithographically structured microcontainers (T. G. Leong, P. A. Lester, T. L. Koh, E. K. Call, D. H. Gracias, Langmuir 2007, 23, 8747-8751). However, the assembly could only be carried out at high temperature (188° C.), in the presence of soldering flux, and in high boiling point (non-aqueous) media. These microcontainers could only be loaded after assembly. Lower temperature assembly has been demonstrated in aqueous media using a low melting point solder (mp 47° C.) (M, Boncheva, G. M. Whitesides, Adv. Mater. 2005, 17, 553-557); however, the structures fabricated were on the millimeter to centimeter scale, and the templates were fabricated by hand in a serial manner. Also, since the low melting point solder used is a stoichiometrically complex bismuth alloy that is deposited by dip-coating; low temperature, parallel, wafer scale self-folding of smaller microstructures has remained a challenge.

Therefore, there remains a need for improved reconfigurable, lithographically produced structures.

SUMMARY

A lithographically structured device according to some embodiments of the current invention have an actuation layer and a control layer operatively connected to the actuation layer. The actuation layer includes a stress layer and a neutral layer that is constructed of materials and with a structure such that it stores torsional energy upon being constructed. The control layer is constructed to maintain the actuation layer substantially in a first configuration in a local environmental condition and is responsive to a change in the local environmental condition such that it permits a release of stored torsional energy to cause a change in a structural configuration of the lithographically structured device to a second configuration, the control layer thereby providing a trigger mechanism. The lithographically structured device has a maximum dimension that is less than about 10 mm when it is in the second configuration.

A method of producing a plurality of devices includes forming a plurality of device structures on a substrate and releasing the plurality of device structures from the substrate. Each device structure of the plurality of device structures includes an actuation layer and a control layer operatively connected to the actuation layer. The actuation layer is constructed of a material and with a structure such that it stores torsional energy upon being constructed, and the control layer is constructed to maintain the actuation layer substantially in a first configuration in a local environmental condition and is responsive to a change in the local environmental condition such that it permits a release of stored torsional energy to cause a change in a structural configuration of the device structure to a second configuration.

A method encapsulating or gripping a sub-millimeter size object includes disposing a lithographically structured device proximate the sub-millimeter size object, the lithographically structured device having a first structural configuration; and changing an environmental condition proximate the lithographically structured device to cause the lithographically structured device to change to a second structural configuration to thereby encapsulate or grip the object. The lithographically structured device has a maximum dimension in the second structural configuration that is less than about 10 mm.

BRIEF DESCRIPTION OF THE DRAWINGS

Further objectives and advantages will become apparent from a consideration of the description, drawings, and examples.

(FIG. 1B) The Ni phalange and the polymer trigger layer were then patterned above the bimetallic layer. (FIG. 1C) The sacrificial layer was dissolved to release the microgripper from the substrate in a planar, open configuration. (FIG. 1D) When heated or exposed to selected chemicals, mechanical property changes in the polymer trigger allowed the stressed bimetallic layer to flex.

FIG. 1A shows a top view schematic of the 2D cruciform. The internal hinges between the frames drove the folding process. Hinges at the outer edges of the faces helped seal the containers upon assembly, Regardless of the face dimensions (50-500 µm), the spacing between faces (and thus the metallic bilayer hinge width) was 50 µm. The width of the photoresist layer in the internal hinges was approximately 25% the face dimension and its length varied between 90-100% of the face dimension. The hinges at the outer edges of the faces were half the width and had the same length of the internal hinges. FIG. 1B shows a side view schematic of the trilayer hinges used to fold microcontainers in both directions. The cruciforms folded in the direction of the Cr layer which was under tensile stress, denoted by $\sigma_T$. Cruciforms with hinges containing Cr below Cu folded downwards while those containing Cr above Cu folded upwards.

(FIG. 3a) Cu evaporated onto Cr resulted in a downward folding of the faces, lifting the whole structure up from the silicon substrate (after the sacrificial layer was dissolved). In this case, the top surface became the outer surface of the container. (FIG. 3b) Alternatively, Cr evaporated onto Cu resulted in upwards folding of the cruciform. Thus, the top surface of the cruciform became the inner surface of the container, and the Cr (with a dark, mirror-like finish) formed the outer surface of the container. (FIG. 3c) The cruciforms assembled en masse at the wafer scale, captured in this image sequence.

(FIGS. 4a-4c) Different size containers with varied surface composition and porosity.

(FIG. 4a-4b) Scanning electron microscope (SEM) images of 100 and 200 µm containers, respectively, formed by downward folding, with the gold coated surfaces of the nickel frames facing outwards. (FIG. 4c) SEM image of a 500 µm container formed by upward folding, resulting in the Cr side of the frame facing outwards. (FIG. 4d-4f) SEM images of defect modes observed with the cubic containers: (FIG. 4d) 500 µm cube with overfolded hinges, (FIG. 4e) 200 µm cube with underfolded hinges, resulting in less than 90° folds, and (FIG. 4f) 50 µm cube with torsion of hinges into a plane orthogonal to the one desired. (FIG. 4g) Optical micrograph featuring many cubic containers that were folded simultaneously, demonstrating the parallel fabrication process. (FIG. 4h-4i) Optical micrograph of a 500 µm cubic container with an encapsulated 275 µm glass bead. (FIG. 4i) Since the pore size of the container is smaller than the bead, the container can be manipulated without the bead falling out. (FIG. 4j) Video sequence of a cruciform folding and encapsulating a dyed, 275 µm glass bead.

FIGS. 5b-5c show optical images of many grippers (face up and face down) triggered to close en masse by heating. SEM images of.

FIG. 6b, 5-digit gripper with 2 joints per digit and FIG. 6c, 6-digit gripper with 3 joints per digit.

(FIG. 8G) Empty gripper with three digits closed such that the distal phalange is parallel to the proximal phalange. (FIG. 8H) Gripper closed around a bead. When the bead was captured, the distal phalanges could not flex completely and pushed against the bead.

FIG. 9 shows dependence of the multilayer joint angle on thin film parameters. Predicted joint angles resulting from a change in polymer elasticity for various Cu thicknesses in the range of 200-250 nm (Cr was kept constant at 50 nm). The joint angles were predicted from the multilayer thin film model. The theoretical calculation reflects the change in the polymer elastic modulus and the resulting joint angle as the polymer layer of the joint is triggered with heat or chemicals.

FIGS. 10A-10I show thermally-triggered actuation, magnetic manipulation, and bead capture according to an embodiment of the current invention. (FIGS. 10A-10B) Optical images of 23 grippers (face up and face down) triggered to close en masse by heating. (FIG. 10C) Overlaid movie sequence showing the remote controlled manipulation of a mobile gripper in a coiled tube. (FIG. 10D) Schematic diagram depicting remote, magnetically-directed movement and capture of a bead on a substrate. (FIGS. 10E-10I) Optical microscopy sequence showing the remote-controlled, thermally-triggered capture of a dyed bead (275 μm) from among several clear beads.

FIG. 11A-11K show thermally- and biochemically-triggered cell capture. (FIG. 11A-11E) Optical microscopy sequence showing the thermally-triggered capture and retrieval of Neutral Red-stained cells from a cell culture mass at the end of a 1.5 mm diameter tube. (FIG. 11F) Zoomed detail of the microgripper with the cells captured in (FIG. 11A-11E) demonstrating viability (red). (FIG. 11G) Fluorescent micrograph demonstrating viability of thermally-triggered capture of LIVE/DEAD® stained cells. Note that the photopatternable polymer in the joints fluoresces red under UV excitation. (FIG. 11H) Fluorescent micrograph with viable cells (green) captured using a thermal trigger and incubated for 72 hours afterwards. (FIG. 11I) Fluorescent micrograph of viable cells captured using a biochemical trigger to actuate the gripper. (FIG. 11J) Optical image of a microgripper with captured cells from a sample of a bovine bladder. (FIG. 11K) Overlaid optical micrograph sequence depicting the traversing of a gripper from left to right through an orifice in a bovine bladder tissue sample.

FIG. 12 is a table of biochemicals commonly used with biological experiments, tested for biochemical triggering of microgrippers according to an embodiment of the current invention.

DETAILED DESCRIPTION

Some embodiments of the current invention are discussed in detail below. In describing embodiments, specific terminology is employed for the sake of clarity. However, the invention is not intended to be limited to the specific terminology so selected. A person skilled in the relevant art will recognize that other equivalent components can be employed and other methods developed without departing from the broad concepts of the current invention. All references cited herein are incorporated by reference as if each had been individually incorporated.

Figure 1A:
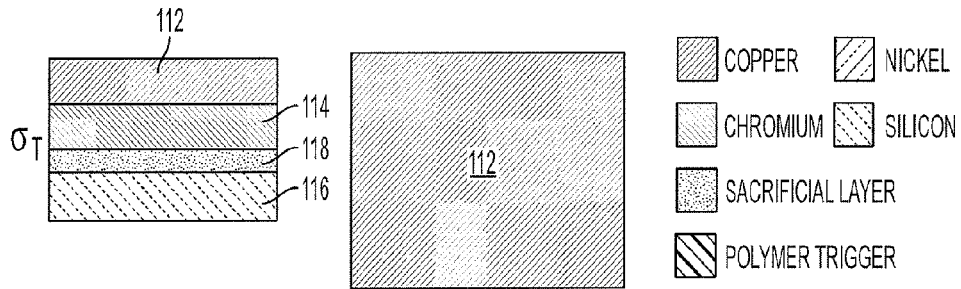
FIGS. 1A-1D is a schematic diagram depicting side and top views of the key steps in the fabrication and operation of a lithographically structured device according to an embodiment of the current invention. A particular example of microgripper is shown, (FIG. 1A) The bimetallic joint component was evaporated above the sacrificial layer and silicon substrate. The Cr layer developed residual tensile stress during evaporation, denoted by $\sigma_T$.
Figure 1B:
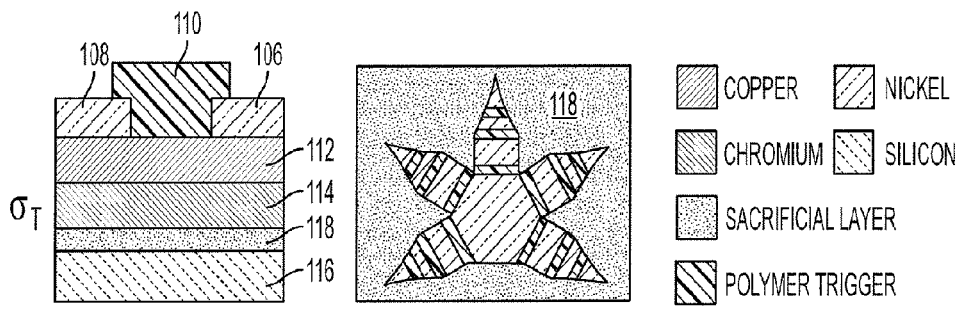
Figure 1C:
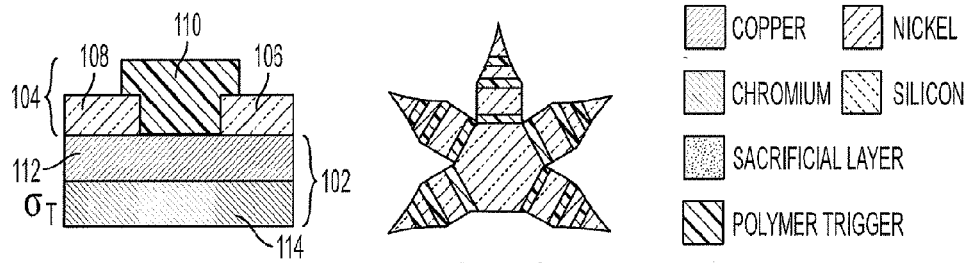
Figure 1D:
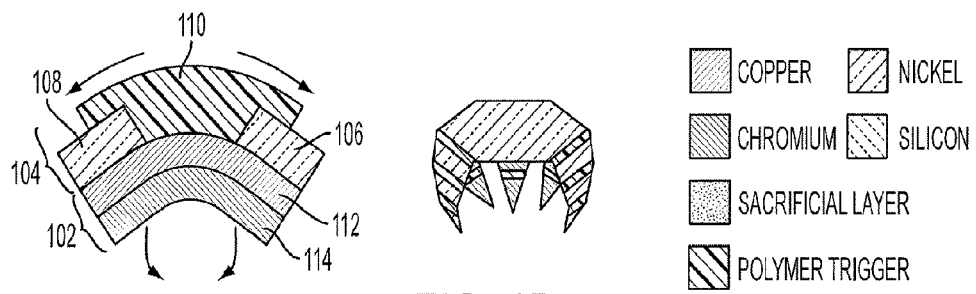

FIGS. 1A-1D provide a schematic illustration of a lithographically structured device 100, and method of manufacture, according to some embodiments of the current invention. The lithographically structured device 100 comprises an actuation layer 102 and a control layer 104 that is operatively connected to the actuation layer 102. The actuation layer 102 comprises a stress layer and a neutral layer and is constructed of materials and with a structure such that it stores torsional energy upon being constructed. The control layer 104 is constructed to maintain the actuation layer 102 substantially in a first configuration (FIG. 1C) in a local environmental condition and is responsive to a change in the local environmental condition such that it permits a release of stored torsional energy to cause a change in a structural configuration of the lithographically structured device 100 to a second configuration (FIG. 1D). In some embodiments, the lithographically structured device 100 can have a maximum dimension that is less than about 1 mm when it is in the second configuration.

The control layer 104 of the lithographically structured device 100 can have a first structural segment 106, a second structural segment 108 and a joint 110 therebetween. The first and second structural segments 106, 108 of the control layer 104 are caused to rotate with respect to the joint 110 by the release of stored torsional energy from the actuation layer 102 after the change in the local environmental condition. This is illustrated schematically in going from FIG. 1C in which the lithographically structured device 100 is substantially flat to FIG. 1D in which the first and second structural segments 106, 108 rotate relative to the joint 110 as is illustrated by the arrows in FIG. 1D. The control layer thus provides a trigger structure that permits the change from the first to the second structural configuration of the lithographically structured device 100.

According to some embodiments of the current invention, the joint 110 can be made of or include a material that changes its stiffness in response to the change in the local environmental condition. The change in the local environmental condition can be, but is not limited to, a change in a local temperature to which the joint 110 is subjected according to some embodiments of the current invention. In some embodiments, the change in temperature can be a relatively small temperature change. For example, the temperature can be, but is not limited to, a temperature change of less than about 20° C. in some embodiments. Smaller temperature changes than 20° C. are also possible according to some embodiments of the current invention. However, other embodiments can include larger changes in temperature than 20° C., if desired. The change in the local temperature to which the joint 110 is subjected can be an increase in temperature from about a standard room temperature to a temperature less than about 40° C., for example. Such low upper temperatures are often suitable for biological applications; however, in other embodiments of the current invention, for example non-biological applications, high final temperatures can used. For example, the final temperature in some embodiments of the current invention may be in the range of 20° C. to 200° C., for example. In other embodiments of the current invention, the joint 110 can be or include a sacrificial material that is caused to be removed in response to the change in the local environmental condition. For example, the change in the local environmental condition can a chemical change that at least one of etches, dissolves or otherwise weakens at least a portion of the sacrificial material of the joint 110.

The actuation layer 102 can be or can include a bi-metallic layer. However, broad concepts of the invention are not limited to only bi-metallic layers. For example, multiple layers of metals could be used in some embodiments of the current invention. Therefore, in some embodiments of the current invention, the actuation layer 102 can be or can include a multi-metallic layer. The actuation layer can have a first layer 112 of a first metal and a second layer 114 of a second metal, for example. The first and second metals can be selected in some embodiments of the current invention such that tensile stress is present in the actuation layer 102 upon being formed. This tensile stress can provide a stored torsional energy according to some embodiments of the current invention. Copper is a suitable material for the first layer 112 and chromium is a suitable material for the second layer 114 according to some embodiments of the current invention. The order of the copper and chromium layers relative to the control layer 104 can be reserved in some embodiments of the current invention.

The joint 110 can be constructed from a polymer according to some embodiments of the current invention. For example, the joint can be formed from a photoresist material. However, the invention is not to only such materials. Other examples can include, but are not limited to, biodegradable polymers, gels, and inorganic materials. The joints can also be made with multilayer films; for example, one can add metals (e.g. gold, platinum), gels, proteins, biomaterials, inorganic oxides and nitrides according to some embodiments of the current invention. In addition, the control layer can be structured to trigger based on a range of biochemicals including, but not limited to, proteases, biomarkers, disease markers, enzymes.

One or more of the structural segments 106, 108 can include, but are not limited to, a magnetic material, such as but not limited to nickel. However, the structural segments 106, 108 are not limited to only magnetic materials and can be constructed from a very wide range on materials that can be selected based on the particular application. The control layer 104 and/or the actuation layer 102 can have layers or regions of other materials formed on them according to the desired application. For example, layers can be added for biocompatibility, bioactivity, chemical activity or physical selectivity according to some embodiments of the current invention.

The left hand column of FIGS. 1A-1D shows a simple device or a portion of a device according to some embodiments of the current invention. For example, complex devices can be constructed that have large numbers of such joint structures similar to that of the left hand column. The right hand column of FIGS. 1A-1D shows an embodiment lithographically structured device that has a plurality of structural segments and a plurality of joints arranged in a pattern selected to form a predetermined three-dimensional structure. In this example, the lithographically structured device is a gripper structure that has a central palm-like segment and multi-joint finger-like structures.

The lithographically structured device 100 is produced on a substrate 116 that has a sacrificial layer 118 of material between the lithographically structured device 100 and the substrate 116. A large number of lithographically structured devices can be produced in parallel on the substrate 116. The lithographically structured devices are then removed from the substrate ("lifted off") by dissolving or otherwise removing the sacrificial layer 118 to provide a plurality of lithographically structured devices. A large number of lithographically structured devices can be produced in parallel in this way such as hundreds, thousands, tens of thousands, or more.

EXAMPLE 1

In this example according to an embodiment of the current invention, we describe the low temperature self-assembly of microcontainers with surfaces that were lithographically patterned in all three dimensions, based on an on-demand, thin film stress driven mechanism. The folding process occurred in water at low temperature, and it allowed for the assembly of containers from 2D, lithographically patterned templates. On-demand, low temperature assembly was enabled by utilizing hinges composed of a metallic bilayer to drive the assembly, coupled with a polymer layer that served as the motion trigger. The trigger is an example of at least a portion of a joint according to some embodiments of the current invention. The low temperature assembly process can be especially relevant for applications in aqueous media and under biologically relevant conditions. In this example, we show the size scaling of the process down to 50 µm, which we believe is the limit of fabrication according to this embodiment due to a characteristic radius of curvature for the particular hinge. We demonstrate that this method allowed for self-folding in two directions, i.e. folding upwards out of plane and folding downwards into the substrate plane, depending on the orientation of the metallic bilayer hinge. We discuss various defect modes that can result from the process and also demonstrate the fabrication of a more complex, encapsulating container: a magnetic cube containing a glass bead. We are not aware of any other method that has been used to assemble microstructures with this added level of complexity, i.e. encapsulation, on-demand.

Figure 2A:
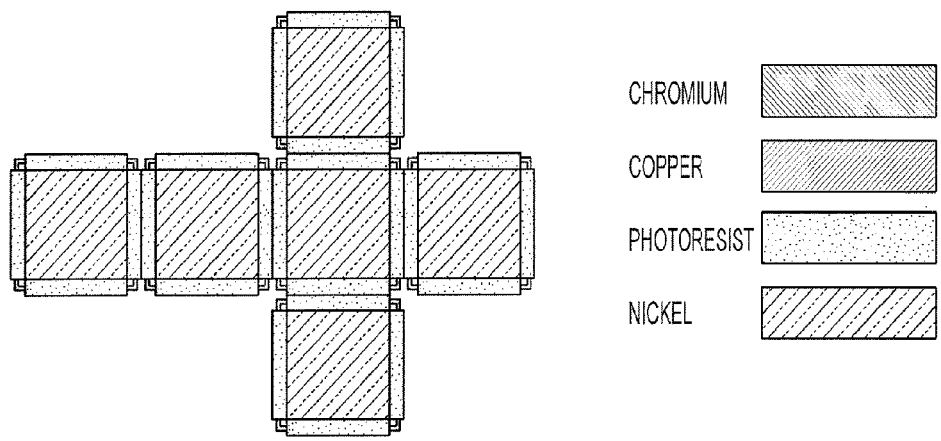
FIGS. 2A and 2B provide a schematic illustration of a 2D cruciform and trilayer hinge structure according to an embodiment of the current invention.
Figure 2B:
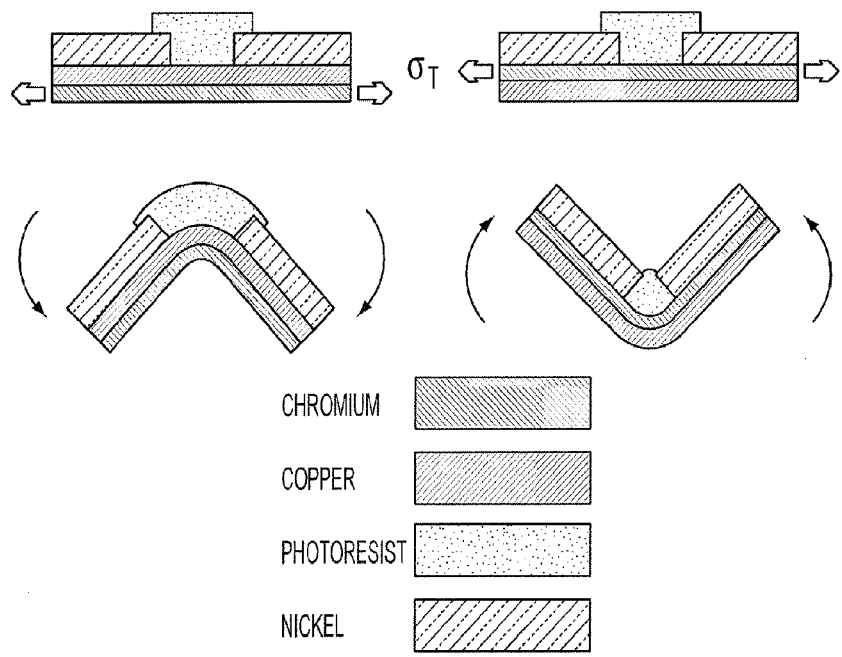

The lower temperature self-assembly of the microcontainers was enabled by the use of trilayer hinges connecting lithographically patterned faces arranged as a cruciform; schematics of the cruciform and a single hinge are shown in FIGS. 2a-2b (for fabrication details, see Experimental Methods). The hinge was composed of a bimetallic component, containing chromium (Cr) and copper (Cu), and a trigger made of photoresist polymer. The self-folding was caused by stress that developed during thermal evaporation of the metal thin films. This stress was partially due to the mismatch in the coefficient of thermal expansion of Cu ($16.6\times10$-$6°$ $C.^{-1}$), Cr ($6.2\times10$-$6°$ $C.^{-1}$) (J. A. Thornton, D. W. Hoffman, *Thin Solid Films* 1989, 171, 5-31), and the underlying polymeric sacrificial layer substrate, but mostly as a result of large intrinsic tension generated during the Cr film growth (R. Abermann, H. P. Martinz, *Thin Solid Films* 1984, 115, 185-194; R. W. Hoffman, R. D. Daniels, E. C. Crittenden, *P. Phys. Soc. Lond. B* 1954, 67, 497-500; E. Klokholm, *J. Vac. Sci. Technol.* 1968, 6, 138-140; E. Klokholm, B. S. Berry, *J. Electrochem. Soc.* 1968, 115, 823-826). Although Cr films have been used previously to spontaneously fold structures based on the high intrinsic stress (W. J. Arora, A. J. Nichol, H. I. Smith, G. Barbastathis, *Appl. Phys. Lett.* 2006, 88, 053108; L. Zhang, D. J. Dong, B. J. Nelson, D. A. Gruetzmacher, presented at IEEE Nano/Micro Engineered and Molecular Systems, Zhuhai, China, January 2006), the Cr/Cu/polymer trilayer hinge was developed in our group. This combination of materials is critical in enabling the low temperature and on-demand assembly according to some embodiments of the current invention. The polymer layer prevented the bimetallic layer from spontaneously folding when the 2D template was released from the substrate at room temperature, and it enabled on-demand folding when heated. The heating process softened the polymer trigger, which allowed the underlying bimetallic layer to relieve the residual stress by bending.

The thickness of the Cr affected the angle of folding. It was observed that a thickness of 50 nm was required to obtain a 90° fold when using a 50 µm wide hinge and a Cu structural layer. Since our structures were cubic containers, we were most interested in obtaining 90° folds. However, intermediate thicknesses (<50 nm) of Cr resulted in reproducible angles of folding between 0 and 90°; without the Cr layer, no folding was observed. The Cu film acted as a structural layer providing stress mismatch with the Cr layer (W. J. Arora, A. J. Nichol, H. I. Smith, G. Barbastathis, *Appl. Phys. Lett.* 2006, 88, 053108), enabling the hinge to bend; its thickness was also varied between 100-300 nm, but minimal effect on the fold angle was observed. However, use of a thicker Cu layer was preferred according to some embodiments, as hinges with less than 200 nm Cu easily ruptured during the photolithographic development process. Thinner Cu layers tended to allow premature attack and dissolution of the sacrificial layer by the water-based developer solution.

Figure 3A:
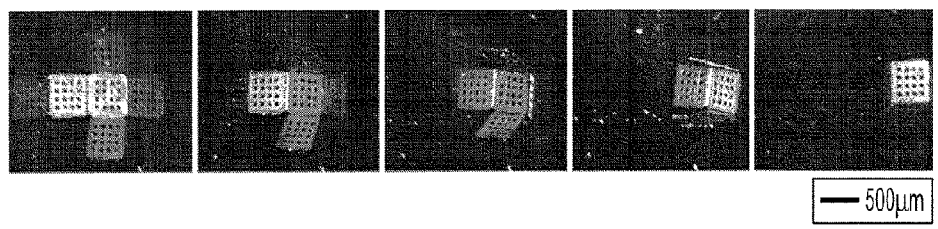
FIGS. 3a-3c show the folding sequence of 500 µm cubes with opposite hinge layer configurations.
Figure 3B:
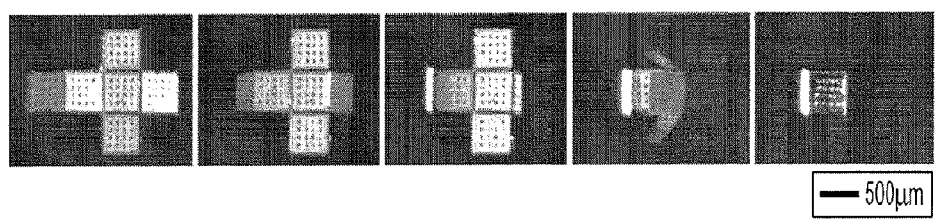

The position of the Cr in the trilayer hinge determined the direction of folding; we observed that by placing the Cr either below or above the Cu structural layer, it was possible to fold the 2D cruciform templates in opposite directions. Shown in FIG. 3 is a video capture sequence of cruciforms folding in downward (FIG. 3a) and upward (FIG. 3b) directions. The bilayer folded in the direction that reduced the lateral dimensions of the Cr layer (to relieve its residual tensile stress). Since the cruciforms could fold in either direction, depending on configuration, there was selectivity between which surface (either the top or bottom) of the cruciform faces was exposed on the exterior of the microcontainer after assembly.

Figure 3C:
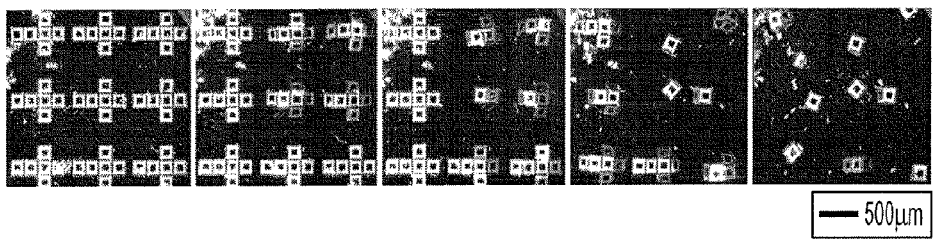

Our assembly method allows for cost-effective, mass fabrication of objects patterned in all three dimensions. A video capture sequence of wafer scale assembly, demonstrating the parallel nature of the self-folding process, is shown in FIG. 3c. The containers can be made in a variety of sizes (50-500 µm) with different surface patterning and in large numbers (FIG. 4) from various materials. Utilizing a ferromagnetic material, such as nickel, to fabricate the cruciforms allowed for the additional trait of remote manipulation (H. Ye, C. L. Randall, T. G. Leong, D. A. Slanac, E. K. Call, D. H. Gracias, *Angew. Chem., Int. Ed* 2007, 46, 4991-4994; *Angew. Chem.* 2007, 119, 5079-5082; B. Gimi, T. G. Leong, Z. Gu, M. Yang, D. Artemov, Z. M, Bhujwalla, D. H. Gracias, *Biomed. Microdev.* 2005, 7, 341-345). The containers were robust enough after assembly to be pipetted and magnetically manipulated in fluid and on substrates. Similar containers that were self-assembled without the polymer layer present in the hinge had low mechanical strength after assembly.

Figure 4A:
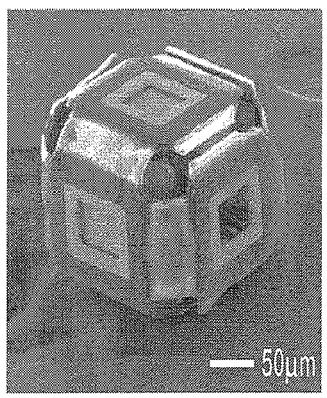
FIGS. 4a-4j show the versatility of the process, defect modes, and encapsulation in an example according to an embodiment of the current invention.
Figure 4B:
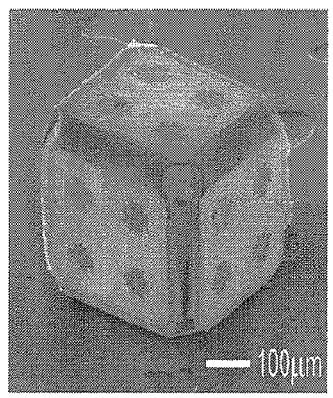
Figure 4C:
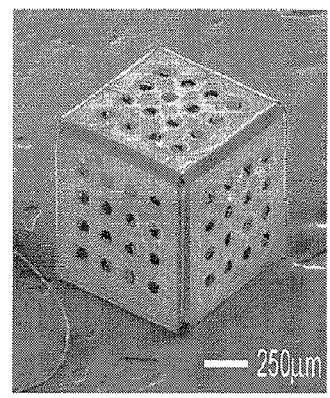
Figure 4D:
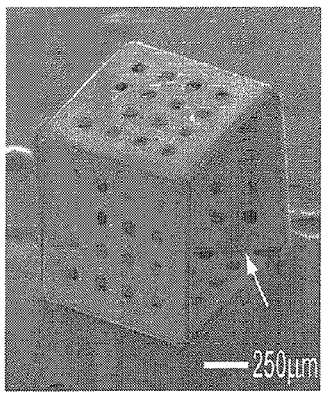
Figure 4E:
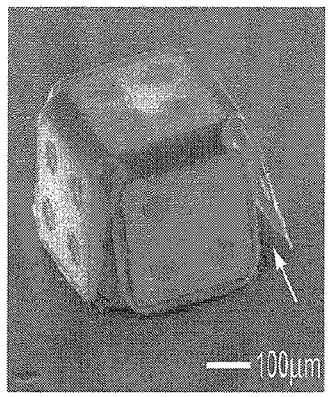
Figure 4F:
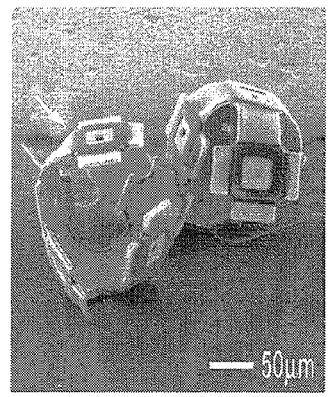
Figure 4G:
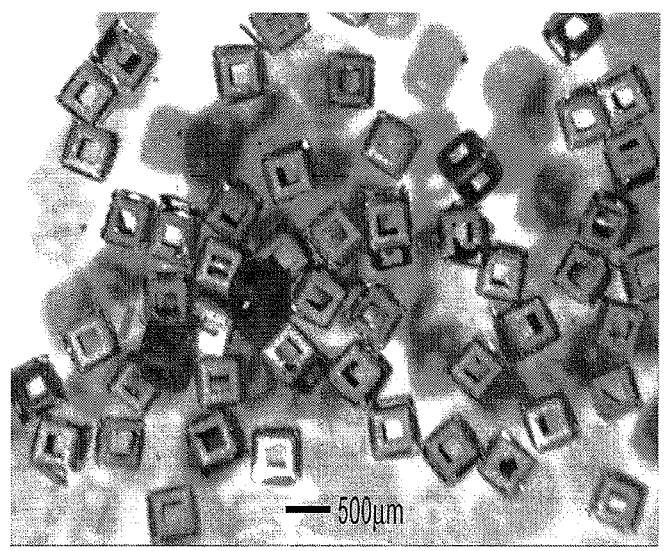

In general, high yields in excess of 90% for the 200 and 500 µm containers were obtained. However, several defect modes in the fabrication process (FIG. 4d-4f) were observed. These modes included overfolded (FIG. 4d) and underfolded (FIG. 4e) containers. These defects occurred due to incorrect targeting of film thicknesses or hinge width and lithographic errors. When containers approximately 50 µm in size were fabricated, a torsional defect where the faces twisted out of the desired folding plane (FIG. 4f)was observed. At this size scale, the geometry of the hinge became square shaped, i.e. the length was equal to the width. Due to this shape, the hinge may not have had a preferential axis of rotation. However, at the 100 µm and larger length scales, large numbers of containers could be successfully fabricated simultaneously (FIG. 4g).

Figure 4H:
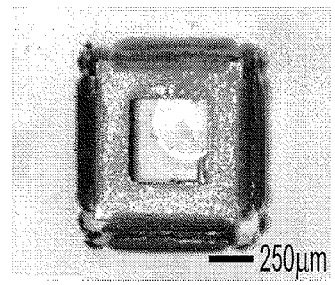
Figure 4I:
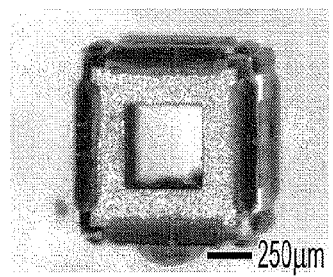
Figure 4J:
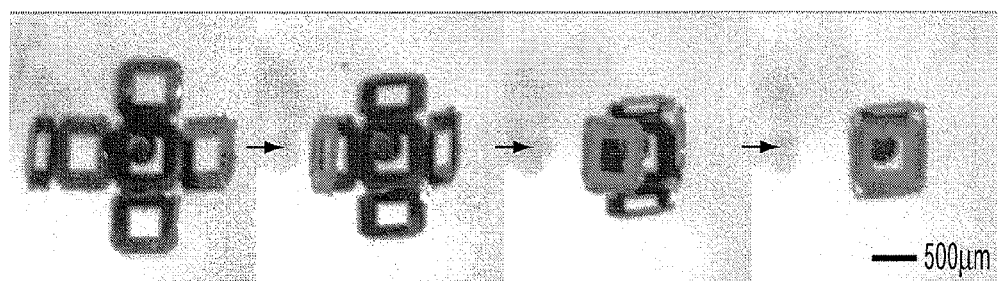

Our assembly method also provides the ability to fabricate complex structures in the form of 3D patterned containers with encapsulated cargo. By self-folding the 2D cruciforms in a medium containing the objects to be encapsulated, the resulting containers were loaded simultaneously with assembly. FIG. 4h-4j features a 500 µm container with a 275 µm glass bead encapsulated within its interior. FIG. 4i demonstrates that the bead was indeed trapped within the cubic container; when the container was manipulated, the bead within it rolled but was unable to escape through the 250 µm pore. FIG. 4j is a video capture sequence taken during the encapsulation of a dyed, 275 µm glass bead.

The flexibility in fold direction when assembling the containers could allow for application versatility. For instance, it may be easier to functionalize the top faces of the 2D cruciform with self-assembled monolayers or coatings to enhance favorable interactions with biological moieties; folding the containers downwards allows the coatings to remain exposed on the outer surfaces of the containers. Alternatively, since the process is compatible with complementary metal oxide semiconductor (CMOS) and microelectromechanical systems (MEMS) fabrication, it could also be used to package microelectronic modules in 3D to construct mobile "smart" containers. To incorporate sensory electronic devices, such as transistors or semiconductor optical elements onto the outer surfaces of the containers, we envision the following scheme: first fabricate the electronic devices, and then fabricate the cruciforms on top of the devices. In this case, since the devices are on the underside of the cruciform, folding the cruciforms upwards would expose the sensory devices on the outer surfaces. Alternatively, the cruciform hinges could be engineered to fold downwards to package and protect the devices within the container. We have previously detailed the ability of similar metallic containers to act as Faraday cages (T. Leong, Z. V. Gu, T. Koh, D. H. Gracias, *J. Am. Chem. Soc.* 2006, 128, 11336-11337) and thus, packaged microelectronic devices would gain protection from electrostatic discharge.

A limitation of the stress-driven, self-folding method is that for a given geometry and composition of the metallic bilayer, there is a characteristic radius of curvature. Hence, we believe that the smallest hinge width that can achieve a 90° fold for our thickness and combination of metals (Cr and Cu) could be the 50 µm width that was used. However, stress-driven curling of unpatterned, metal sheets with nanoscale radii has been demonstrated with other material combinations and deposition methods (Q. G. Schmidt, K. Eberl, *Nature* 2001, 412, 42). Thus, in order to scale down the size of stress-driven, self-assembled complex structures, other material combinations and geometries will have to be explored, in addition to performing experiments to test parameters important for thin film growth, such as deposition rate, deposition method, and substrate temperature.

In conclusion, we have demonstrated a straightforward and versatile strategy to fabricate lithographically patterned, hollow microcontainers at low processing temperatures that can be loaded with objects as they assemble according to an embodiment of the current invention. The process is flexible, since in addition to controlling size, material, and porosity, the resulting structures can be folded in opposite directions based on the film orientation within a trilayer hinge; this can be especially important for the fabrication of containers with different surface functionalities. Additional traits, such as Faraday cage behavior and magnetism, can further enhance the versatility of the microcontainers. We believe that the Cr/Cu/polymer combination utilized is just one of many thin film combinations that will be useful for on-demand self-assembly. We envision that the strategy can be adapted with other material and dimension combinations to fabricate even smaller containers for applications such as device packaging, and construction of "smart" containers with enhanced functionality, such as integrated sensor modules or those with on-demand, reversible opening and closing capability,

EXPERIMENTAL PROCEDURES

Fabrication of the Microcontainers

A sacrificial layer of poly(vinyl alcohol) (PVA, MW: 6K) [Polysciences, Inc.] was spun onto cleaned silicon (100) wafers. A Cr layer (0-50 nm) and a Cu layer (100-300 nm) were thermally evaporated onto the PVA-coated wafers at a pressure of ~$8\times10^{-6}$ Torr; the order of deposition depended on the desired orientation of the hinge fold. After the thin film deposition, Rohm and Haas S C 1827 photoresist [Microchem] was spincoated onto the wafer. The thickness of the photoresist (3.25 μm) was controlled via the spin speed. After a soft bake, the resist was exposed to UV light using an Ultra μline Series Quintel mask aligner [Quintel Corp.] and patterned using a transparency mask [Fineline Imaging] with the frame features. The photoresist features were developed using Shipley 351 (1:6 dilution with water) [Microchem], and the metallic frames of the microcontainers were electrodeposited within the photoresist mold to a height of 8 μm, using commercial electrolytic solutions. For magnetic microcontainers, nickel (Nickel Sulfamate RTU) [Technic, Inc.] was electroplated as the frame material. A thin layer of gold (TG-25E RTU) [Technic, Inc.] was electroplated above the frame metal for increased etch resistance. All electrodeposition was performed in a constant current mode [Princeton Applied Research]. The first layer of photoresist was lifted off and then a second round of photolithography patterned the photoresist hinges; a 3.25 μm layer of SC1827 was spun on top of the substrate and exposed to the hinge mask, consisting of internal (folding) and external (sealing) hinges. Alignment marks were used to ensure proper registry of the hinges to the 2D precursor frames. After the hinge patterns were developed, the exposed Cu/Cr regions surrounding the 2D templates were etched using commercial etchants (APS-100 for Cu and CRE-473 for Cr [Transene Company, Inc]). The silicon wafers with the tethered 2D templates, composed of metal frames connected by photoresist and metal thin-film trilayer hinges, were immersed in water to dissolve the sacrificial PVA layer and release the templates from the wafer. The templates were heated to >40° C. to fold into the three-dimensional containers. When templates are heated in the presence of beads, they encapsulate them.

EXAMPLE 2

In this example, we describe the first mass producible, mobile grippers and demonstrate the capture and retrieval of microscale objects, including live cells, without batteries, wiring, or tethers. The grippers can be moved remotely using a magnet, and they can be actuated en masse in air, water, and biological media, based on low temperature triggers.

Present day human engineered microscale machines, such as grippers, are controlled by external pneumatic, hydraulic, or electrical signals (Angelo, J. A.; Robotics, A reference guide to a new technology (Greenwood Press, 2006). (b) Kim, C.-J., Pisano, A. P., Muller, R. S., Urn, M. G., paper presented at the IEEE Solid-State Sensor and Actuator Workshop, 4th Technical Digest, Hilton Head Island, S.C., USA 1990. (c) Yeh, R. Kruglick, E. J. J. Pister, K. S. J. J. Microelectromech. Syst. 1996, 5, 10 (March, 1996). J. Cecil, D. Powell, D. Vasquez, Robot, Com-int. Manuf. 23, 580 (October, 2007). Novel approaches, utilizing actuators composed of alloys (Lee, A. P.; Clarlo, D. R.; Krulevitch, P. A., Lehew, S., Trevino, J., Northrup, M. A., Sens. Actuators A-Phys. 1996, 54, 755), polymeric balloons (Lu, Y. W., Kim, C. J. Appl. Phys. Lett. 2006, 89, 164101), thin film hinges and electroactive polymer actuators (Jager, E. W. H.; Smela, E.; Inganas, O, Science 2000, 290, 1540-1545; Shahinpoor, M.; Bar-Cohen, Y.; Simpson, J. O.; Smith, J.; Smart Mater. Struct. 1998, 7, R15-R30) also require tethered operation. Since these actuators are controlled through external wires or tubing, they require connections to be made directly, or in close proximity (enabling the application of electric fields), to these devices. Many of these microscale actuators also only operate under limited ambient environments, such as at high temperature, non-aqueous media, or ionic solutions, which limits their versatility. Additionally, the need for tethers restricts their miniaturization, maneuverability, and cost reduction.

Figure 5A:
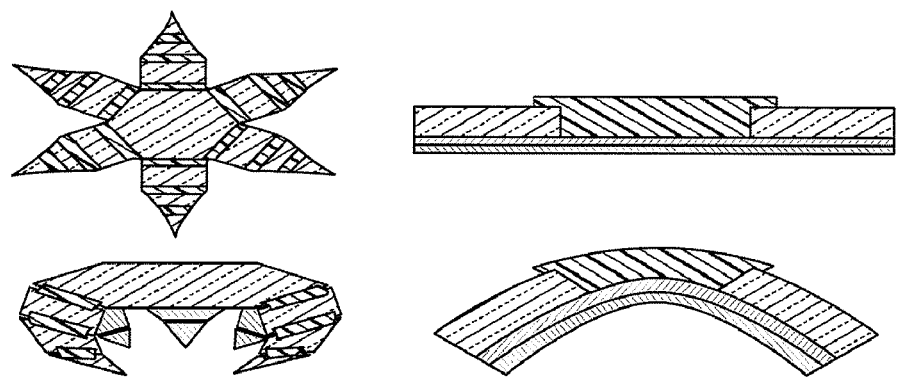
FIG. 5a shows a schematic diagram featuring top and side views of a gripper in the open and closed states, along with the corresponding side views of the trilayer hinge, according to an embodiment of the current invention.

Our grippers according to an embodiment of the current invention were designed in the shape of biological claws with rigid nickel (Ni) phalanges connected by (chromium-copper-polymer, Cu/Cr/polymer) trilayer joints. The grippers consisted of a flat central strip (palm) surrounded by four to six finger-like digits (FIG. 5a). Each digit was tapered and consisted of two or three thick metallic segments (phalanges) separated by thin trilayer joints that drove actuation. In the thick phalanges of the gripper, the ferromagnetic nickel (Ni) allowed for remotely-guided movement in an arbitrary trajectory using a magnet. The concerted motion of gripping was achieved on-demand, when the polymeric trigger layers within the joints were softened, by heating above 40° C., allowing the release of residual tensile stress in the nanoscale Cr/Cu thin film components of the joints. Hence, the grippers did not require any external tethers and could be triggered in a variety of media. The mobile grippers were either "set-free" from their fabrication substrate in large numbers, or remotely and precisely moved on substrates using a magnet.

Our grippers were structured on a hierarchy of length scales from the nano to the millimeter. The films driving actuation were merely 50-300 nm thick; the phalanges and joints were tens to hundreds of microns in width and approximately eight microns thick, while the overall size of the grippers ranged from 1.4 to 1.8 mm when open and 350-500 μm when closed. The fabrication of the grippers was straightforward and involved relatively simple photolithographic fabrication on silicon substrates. Two layers of photolithography were used to pattern the phalanges and hinges respectively. The Cr/Cu thin films were deposited by evaporation while the thick Ni was electrodeposited. The entire structure was constructed on a water soluble polyvinyl alcohol sacrificial layer. The grippers closed due to the coordinated rotation of bimetallic (Cr/Cu) joints that connected the thick rigid Ni phalanges, based on a stress release mechanism (Chua, C. L.; Fork, D. K.; Van Schuylenbergh, K.; Lu, J.-P.; J. Microelectromech Syst. 2003, 12, 989; Moiseeva, E.; Senousy, Y. M.; McNamara, S.; Harnett, C. K. J. Micromech. Microeng. 17, N63 (September, 2007); Schmidt, Q. G. Eberl, K. Nature 2001, 412, 42; Suzuki, K. Shimoyama, I. Miura, H. J. Microelectromech. Syst. 1994, 3, 4; Arora, W. J.; Nichol, A. J.; Smith, H. I.; Barbastathis, G., Appl. Phys. Lett. 2006, 88) (FIG. 5a). The joints curved as a result of a release of large residual stress in the films (Abermann, R. Martinz, H. P. Thin Solid Films 1984, 115, 185; Hoffman, R. W. Daniels, R. D. Crittenden, E. C. Proc. Phys. Soc. London, Sec. B 1954, 67, 497; Klokholm, E. Berry, B. S. J. Electrochem. Soc. 1968, 115, 823). The mechanism for curvature can be rationalized as follows: thermally evaporated Cr films are in a state of tensile stress that develops, due to inherent low adatom mobility of Cr (Abermann, R, paper presented at the Materials Research Society, Boston, Mass., USA, Dec. 2-5, 1991) at typical substrate temperatures during deposition (below 150° C.). Thick Cu films, on the other hand, exhibit slightly compressive to essentially neutral stresses because of the high adatom mobility of Cu (Abermann, R. paper presented at the Materials Research Society, Boston, Mass., USA, Dec. 2-5, 1991), even at room temperature. Hence, when the Cr/Cu bilayer hinges are released from the substrate, the bilayer bends in a direction such that the Cr film is on the inner side of a concave curvature. It should be noted that there is also a mismatch in the coefficient of thermal expansion of Cr (6.2× 10-6° C.-1) and Cu (16.6×10-6° C.-1) (25); however, this stress contribution is not expected to be significant at the operation temperatures of the gripper Arora, J.; Nichol, A. J.; Smith, H. I.; Barbastathis, G., *Appl. Phys. Lett.* 2006, 88).

We experimented with different thicknesses of Cr and Cu in the range of 0-50 nm for Cr and 150-300 nm for Cu. The Cr layer was critical to the rotation of the joints; no curvature was observed without it, while even a thin layer of Cr (5 nm) caused the flexible joints to curve. A chromium thickness of 50 nm caused an approximate rotation angle of 90° for the 50 µm joint widths used in our designs. The Cu layer functioned primarily as a structural support and a variation of the thickness range of the Cu films did not appear to affect the curvature.

Figure 5B:
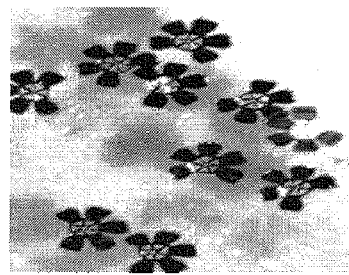
Figure 5C:
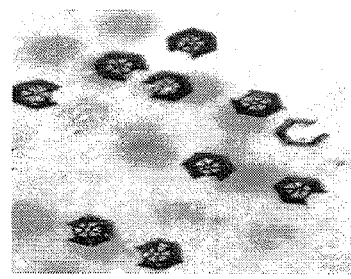

Grippers with joints constructed solely of the bimetallic Cr/Cu layer closed spontaneously when lifted off from the substrate. This uncontrollable response precluded truly mobile and functional grippers. To achieve triggered control, we patterned a "close-stop", a 3 µm thick polymer segment on top of the bilayer metallic joint; this close-stop begins to soften at 40° C. Hence, the rotation of this trilayer joint and, hence the actuation of the gripper, could now be activated remotely based on temperature. Additionally, the polymer increased the structural integrity of both the open and closed gripper. The actuation was reproducibly coordinated and large numbers of grippers could be triggered to close simultaneously in aqueous media (FIGS. 5b, 5c) and even in air. Hence, it is possible not only to fabricate, but also to actuate grippers en masse and at different locations in a relatively straightforward manner. In contrast, it is extremely challenging to connect and trigger large numbers of tethered grippers at different spatial locations.

Figure 5D:
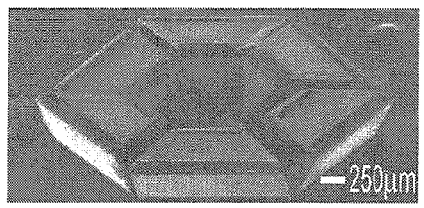
FIG. 5d, a closed 6 digit gripper with 3 joints per digit, palm facing up and FIG. 5e, a closed 5-digit gripper with 3 joints per digit, palm facing down.
Figure 5E:
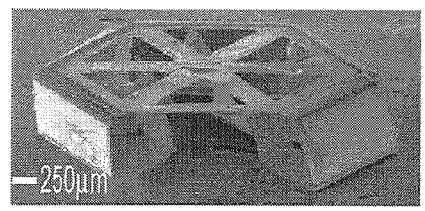

Shown in FIGS. 5d, 5e are SEM images of closed grippers with six and five digits; in order for these grippers to close, a total of 18 and 15 joints respectively, needed to rotate in a concerted manner. What is perhaps even more remarkable is that, although the grippers are hundreds of microns to millimeters in size, their actuation forces are derived predominantly from nanoscale (50 nm thick Cr) films present from the joints.

Figure 6A:
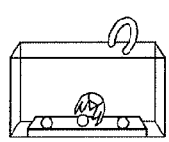
FIG. 6a is a schematic diagram depicting remote, magnetically-directed movement of a gripper within a fluidic medium to capture beads on a substrate. SEM images of gripper with captured beads.
Figure 6B:
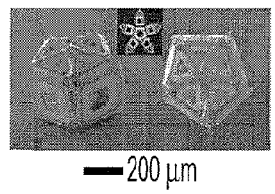
Figure 6C:
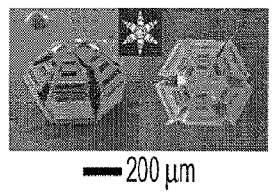
Figure 6D:
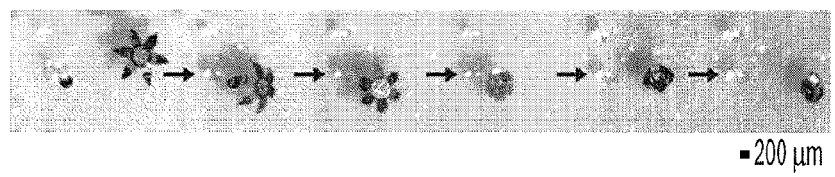
FIG. 6d shows snapshots from video microscopy showing the remotely controlled capture of a dyed bead (~250 µm) from among several clear beads.
Figure 7A:
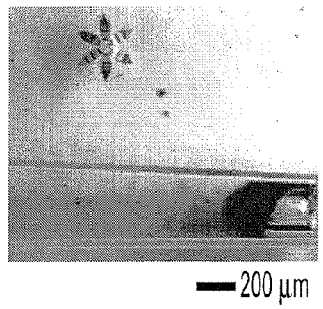
FIGS. 7a-7e show snapshots from video microscopy showing the remotely controlled guidance of a gripper into a capillary (2 mm diameter) followed by the remotely controlled capture of a cell cluster from a dense cell mass and then retrieval of the gripper with grasped cells.
Figure 7B:
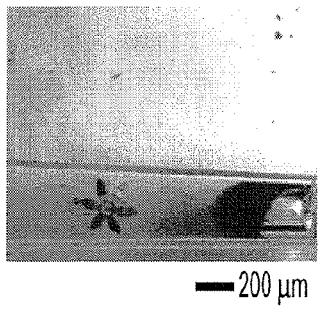
Figure 7C:
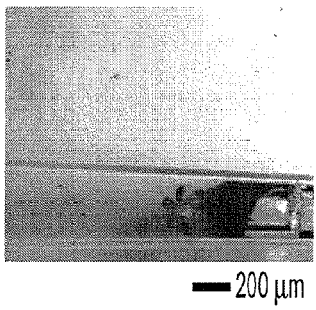
Figure 7D:
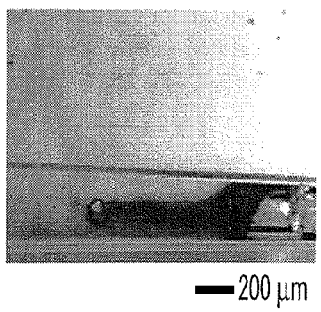
Figure 7E:
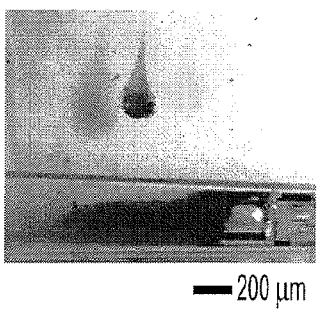
Figure 7F:
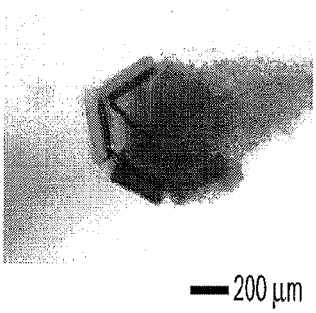
FIG. 7f shows a zoomed-in snapshot of the gripper with live cells in its grasp.

Both open and closed grippers could be moved with a magnet from distances as far away as ten centimeters. By enabling remote control of both movement and the closure of the grippers, it was possible to perform spatio-temporally controlled capture and retrieval of beads (FIGS. 6a-6c). Shown in FIG. 6d is a mobile, tetherless gripper that was remotely manipulated to selectively retrieve a dyed bead from among numerous colorless beads. After the gripper was moved over the bead, the temperature of the solution was increased to trigger closing. Once the gripper had grasped the bead, it held the bead firmly and could be moved with the bead in its grasp. Contained in FIG. 6b, 6c are SEM images of retrieved grippers with two and three joints per digit, respectively, that contain captured beads. In general, we observed that grippers composed of digits with multiple joints had a higher overall degree of bending, leading to a tighter grip on objects. The cause of this tighter closing is best observed in FIGS. 5d, 5e where the distal phalanges of grippers with digits composed of three joints are parallel to the proximal phalanges in the closed gripper.

We exploited the fact that the grippers work under biological conditions, to capture a cluster of cells from a dense cell mass deposited at the end of a narrow capillary. This demonstration highlights possible applications in lab-on-a-chip devices and in microsurgical applications, such as biopsies. Shown in FIG. 7 is a gripper that was remotely guided into the capillary and triggered to grasp a portion of a living cell mass stained with Neutral Red (a red stain that accumulates in lysosomes after diffusing through the cell membrane of viable cells). The gripper was then guided out of the capillary with the captured cells in its grasp; the cells were still viable, as indicated by their red color (signifying that the cell membranes were still intact). FIG. 3f shows a zoomed in image of the gripper with the cluster of cells after retrieval. The nanoscale (50 nm thick Cr) films present within the joints of the grippers were strong enough to grab, hold on to, and separate cells from the cellular mass. Also, the materials used in the fabrication of the gripper are not toxic, at least for contact times of up to 72 hours, as verified in our laboratory using in vitro direct-contact cytotoxicity tests (Randall, C. L.; Leong, T. G.; Bassik, N.; Gracias, D. H. *Adv. Drug Del. Rev.* 2007, 59, 1547). Moreover, it is known that such metallic structures can be easily imaged (Gimi, B; Leong, T.; Cu, Z.; Yang, M.; Artemov, D.; Bhujwalla, Z.; Gracias, D. H. *Biomed Microdevices* 2005, 7, 341-345) using magnetic resonance techniques and also locally heated using radio frequency (RF) fields (Ye, H.; Randall, C.; Leong, T.; Slanac, D.; Call E.; Gracias, D. H. *Angew Chem. Int. Edit* 2007, 46, 4991). These characteristics may be important in guiding and triggering remote retrieval in vivo. Local heating using remote RF fields can also facilitate triggering of specified grippers, if needed. According to conventional techniques, in vivo capture and retrieval is only possible through the use of electrically wired, tethered actuators or endoscopic probes. As compared to tethered grippers, our mobile ones can easily be moved in coiled tubes.

EXAMPLE 3

Biological function in nature is often achieved by autonomous organisms and cellular components triggered en masse by relatively benign cues, such as small temperature changes and biochemicals. These cues activate a particular response, even among large populations of spatially separated biological components. Chemically-triggered activity is also often highly specific and selective in biological machinery. Additionally, mobility of autonomous biological entities, such as pathogens and cells, enables easy passage through narrow conduits and interstitial spaces.

As a step towards the construction of autonomous microtools, we describe mass-producible, mobile, thereto-biochemically actuated microgrippers. The microgrippers can be remotely actuated when exposed to temperatures above 40° C. or selected chemicals. The temperature trigger is in the range experienced by the human body at the onset of a moderate to high fever, and the chemical triggers include biologically-benign reagents, such as cell media. Using these microgrippers, we achieved a diverse set of functions, such as picking up beads off substrates and removing cells from tissue samples.

Conventional microgrippers are usually tethered and actuated by mechanical or electrical signals (Angelo J A (2006) *Robotics, A reference guide to a new technology* (Greenwood Press. Westport, Conn., USA); Madden J D (2007) Mobile robots: Motor challenges and materials solutions. *Science*

318: 1094-1097; Cecil J, Powell D, Vasquez D (2007) Assembly and manipulation of micro devices—A state of the art survey. *Robot Com-int. Manuf.* 23: 580-588; Kim C J, Pisano A P, Muller R S, Lim M G (1992) Polysilicon microgripper. *Sensor. Actuat. A-Phys.* 33: 221-227; Pister K S J, Judy M W, Burgett S R, Fearing R S (1992) Microfabricated hinges. *Sensor. Actuat. A-Phys.* 33: 249-256; Lee A P, et al. (1996) A practical microgripper by fine alignment, eutectic bonding and SMA actuation. *Sensor. Actuat. A-Phys.* 54: 755-759). Recently-developed actuation mechanisms using pneumatic (Lu Y W, Kim C J (2006) Microhand for biological applications. *Appl. Phys. Lett.* 89: 1641011-1641013), thermal (Luo J K, et al. (2006) Modelling and fabrication of low operation temperature microcages with a polymer/metal/DLC trilayer structure. *Sensor. Actuat. A-Phys.* 132: 346-353), and electrochemical triggers (Jager E W H, Inganäs O, Lundström I (2000) Microrobots for micrometer-size objects in aqueous media: Potential tools for single-cell manipulation. *Science* 288:2335-2338; Shahinpoor M, Bar-Cohen Y, Simpson J O, Smith J (1998) Ionic polymer-metal composites (IPMCs) as biomimetic sensors, actuators and artificial muscles—a review. *Smart Mater. Struct,* 7: R15-R30) have also utilized tethered operation. Since the functional response of currently available microgrippers is usually controlled through external wires or tubes, direct connections need to be made between the gripper and the control unit. These connections restrict device miniaturization and maneuverability. For example, a simple task such as the retrieval of an object from a tube is challenging at the mm and sub-mm scale, as tethered microgrippers must be threaded through the tube. Moreover, many of the schemes used to drive actuation in microscale tools utilize biologically incompatible cues, such as high temperature or non-aqueous media, which limit their utility. There are novel, untethered tools based on shape memory alloys that utilize low temperature heating, but they have limited mobility and must rely solely on thermal actuation (Buckley P R, et al. (2006) Inductively heated shape memory polymer for the magnetic actuation of medical devices. *IEEE T Biomed. Eng.* 53: 2075-2083; Small W, et al. (2007) Prototype fabrication and preliminary in vitro testing of a shape memory endovascular thrombectomy device. *IEEE T Biomed. Eng.* 54: 1657-1666). The ability of our gripper design to utilize biochemical actuation, in addition to thermal actuation, represents a paradigm shift in engineering and suggests a strategy for designing mobile microtools that function in a variety of environments with high specificity and selectivity.

In order to engineer untethered, mobile grippers, we developed an actuation mechanism that utilized trilayer joints composed of a polymer and a stressed bimetallic thin film patterned between rigid phalanges (FIGS. 1A-1D). The microgrippers were fabricated using conventional multilayer photolithography on a water-soluble sacrificial polyvinyl alcohol layer; this allowed open grippers to be released from the substrate in water. Briefly (detailed in the Methods), chromium (Cr) and copper (Cu) thin films were thermally evaporated onto the sacrificial layer that had been spin-coated on a silicon wafer. Then, two steps of photolithography were performed to fabricate the microgrippers: the first step patterned nickel (Ni) and gold (Au) phalanges, and the second step patterned the polymer trigger and bimetallic (Cr/Cu) layer of the joint. This process enabled large numbers of grippers to be fabricated in a highly parallel and cost-effective manner.

Figure 8A:
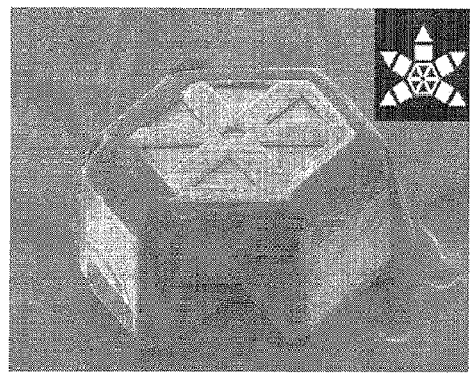
FIG. 8A-8H show scanning electron microscope (SEM) images highlighting variability in rotational symmetry, number of digits and palm shape, and number of joints per digit. Closed microgrippers with a rotationally (FIG. 8A) asymmetric and (FIG. 8B) symmetric arrangement of digits along the central palm. Note the gap in gripper (FIG. 8A) that resulted due to the asymmetry. The insets depict the layout of the gripper when open. Closed grippers with (FIG. 8C) pentagonal, (FIG. 8D) hexagonal, and (FIG. 8E) heptagonal palms and a symmetric arrangement of digits. Closed grippers with (FIG. 8F) two-jointed digits and (FIG. 8G-8H) 3-jointed digits. The insets depict the open configuration of each digit.
Figure 8B:
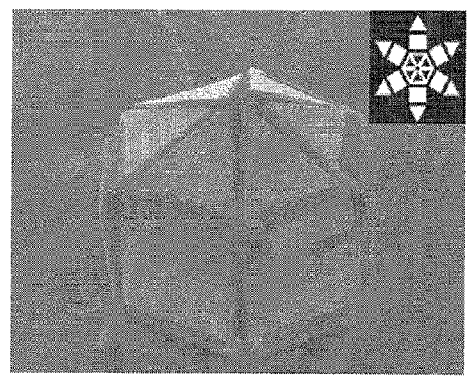
Figure 8C:
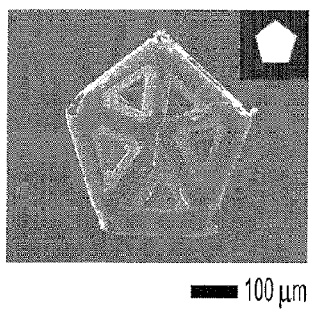
Figure 8D:
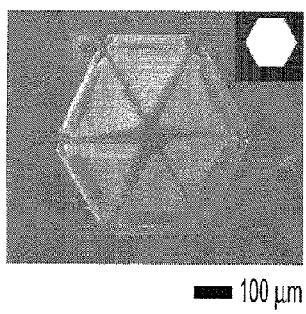
Figure 8E:
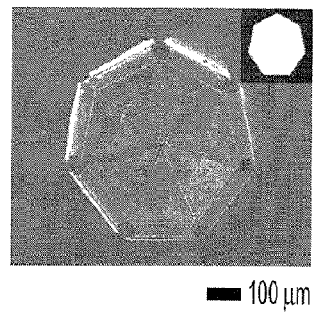
Figure 8F:
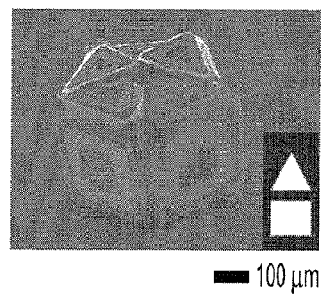
Figure 8G:
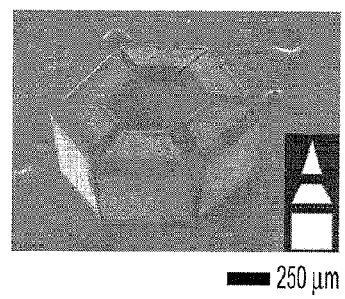
Figure 8H:
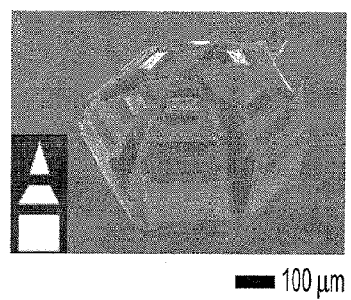

The grippers were structured on a hierarchy of length scales; the films driving actuation were 50-300 nm thick and the phalanges and joints were tens to hundreds of microns in width and approximately seven microns thick. The entire gripper system was self-contained with a size as small as 700 µm when open and 190 µm when closed. The overall shape of the microgrippers was modeled after biological appendages, such as hands, in which the jointed digits are arranged in different ways around a central palm. For example, the digits in the human hand are arranged in a rotationally asymmetric manner and contain a varying amount of joints; four digits contain three interphalangeal joints, while the fifth (thumb) only has two (Flatt A E (2002) Our thumbs. *Proc (Bayl. Univ. Med. Cent.*) 15: 380-387). In our gripper designs, we varied the number and arrangement of digits around the palm (FIGS. 8A-8B), the shape of the central polygonal palm (FIGS. 8C-8E), and the number of interphalangeal joints (FIGS. 8F-8H). We also incorporated tapered distal phalanges (emulating sharp nails or claws) to enable extrication of cells and tissue in our experiments.

We observed that an asymmetric arrangement of digits left a large gap within the closed gripper (FIG. 8A), while grippers with a symmetrical arrangement of digits (FIG. 8B) retained objects more effectively. We observed that grippers with less digits were more likely to close properly (higher yield), since a smaller number of joints needed to flex. However, we observed that grippers with more digits had an increased defect tolerance and were still able to hold on to objects in spite of a few defective joints. In our study, we found that grippers with six rotationally symmetric digits achieved a sufficient balance between yield and defect tolerance.

The microgripper digits were inspired by the dicondylic joints of arthropods (Chapman R F (1982) *The insects: structure and function* (Harvard University Press, Cambridge, Mass., USA)) and designed as a series of rigid Ni and Au phalanges, interconnected by hybrid organic-inorganic flexible trilayer joints. The joints consisted of two components: a Cr/Cu thin film bilayer and a polymer trigger (FIGS. 1A-1D). When actuated, grippers with two-jointed digits (FIG. 8F) formed right prisms, whereas grippers with three-jointed digits (FIG. 8G) curled into themselves, such that the distal and proximal phalanges were parallel. We observed that grippers with three-jointed digits held onto beads tighter than those with two-jointed digits. This increased grip was due to the fact that the extra joint was unable to relieve all of its residual stress; hence, the distal phalange pressed against the captured bead that impeded its motion (FIG. 8H). Thus, for capture and retrieval experiments, we utilized rotationally symmetric, six-digit, three jointed grippers.

The metallic bilayer of the joints was crucial to the operation of the gripper according to this embodiment of the current invention. We fabricated a stressed Cr thin film by thermal evaporation (Abermann R, Martinz H P (1984) Internal stress and structure of evaporated chromium and MgF2 Films and their dependence on substrate temperature. *Thin Solid Films* 115: 185-194; Hoffman R W, Daniels R D, Crittenden E C, Jr (1954) The cause of stress in evaporated metal films. *Proc. Phys. Soc. London, Sec. B* 67: 497-500; Klokholm E, Berry B S (1968) Intrinsic stress in evaporated metal films. *J. Electrochem. Soc.* 115: 823-826; Thornton J A, Hoffman D W (1989) Stress-related effects in thin films. *Thin Solid Films* 171: 5-31) and subsequently evaporated a minimally-stressed Cu film to form the bilayer. The flexing of the bimetallic joints (to close the gripper) was driven by the release of residual tensile stress within the Cr thin film, and similar bending behavior of stressed thin films has been previously observed (Luo J K, et al. (2006) Modelling and fabrication of low operation temperature microcages with a polymer/metal/ DLC trilayer structure. *Sensor. Actuat. A-Phys.* 132: 346-353; Arora W J, Nichol A J, Smith H I, Barbastathis G (2006) Membrane folding to achieve three-dimensional nanostructures: Nanopatterned silicon nitride folded with stressed chromium hinges. *Appl. Phys. Lett.* 88: 0531081-0531083; Chua C L, Fork D K, Van Schuylenbergh K, Lu J P (2003) Out-of-plane high-Q inductors on low-resistance silicon. *J. Microelectromech. S.* 12: 989-995; Moiseeva E, Senousy Y M, McNamara S, Harnett C K (2007) Single-mask microfabrication of three-dimensional objects from strained bimorphs. *J. Micromech. Microeng.* 17: N63-N68; Schmidt O G, Eberl K (2001) Thin solid films roll up into nanotubes. *Nature* 410: 168; Doerner M F, Nix W D (1988) Stresses and deformation processes in thin films on substrates. *CRC. CR. Rev. Sol. State.* 14: 225-268; Leong T G, Benson B R, Call E K, Gracias D H (2008) Thin film stress-driven self-folding of microstructured containers. *Small* 4: 1605-1609). We found both experimentally, as well as theoretically (FIG. 9), that a bimetallic layer composed of 50 nm Cr and 200-250 nm Cu reproducibly resulted in joint flexing angles of approximately 90°.

Microgrippers with joints comprised of only the metallic bilayer closed spontaneously when released from the substrate. However, the addition of the polymer layer to form trilayer joints enabled triggered control over the closing of the gripper. The polymer layer also increased the mechanical strength of the gripper. In our present study, we used a commercial photoresist in which the polymer is a cresol novolak resin (details in Methods). Cresol novolak resin-based photoresists that have not been hard baked experience a thermal transition point in the range of 40-60° C. (Morton S L, Degertekin F L, Khuri-Yakub B T (1999) Ultrasonic sensor for photoresist process monitoring. *IEEE T. Semiconduct. M.* 12: 332-339; Gogolides E, Tegou E, Beltsios K, Papadokostaki, Hatzakis M (1996) Thermal and mechanical analysis of photoresist and silylated photoresist films: Application to AZ 5214™, *Microelectron. Eng.* 30: 267-270; Paniez P J, Chollet J-P E, Pons M J (1993) Thermal properties of state of the art novolak-diazonaphtoquinone systems: Differences between bulk and film properties. *Proc. SPIE* 1925: 614-625). We verified this transition on our processed polymer films with differential scanning calorimetry. When heated, the mechanical properties of the polymer were altered and grippers heated above 40° C. closed. The grippers could also be actuated by chemicals that altered the mechanical properties of the polymer (through processes such as softening or chemical degradation). Chemicals that dissolved or caused delamination of the polymer layer from the joint also triggered the closing of the gripper. Prior to either thermal or chemical actuation, the polymer was stiff and well-adhered enough to the underlying Cr/Cu bilayer to prevent the spontaneous flexing of the individual joints, thereby keeping the gripper flat and open. When the mechanical properties of the polymer were altered (by thermal or chemical cues), the Cr/Cu bilayer beneath was allowed to flex, resulting in the closure of the gripper. Thus, trilayer-jointed microgrippers remained open after release from the fabrication substrates (FIG. 10A) and closed en masse (FIG. 10B) only when triggered. A variety of chemicals, including organic solvents (e.g. acetone, alcohols, N-methylpyrrolidone, and dimethyl sulfoxide) and caustics (e.g. sodium and potassium hydroxides) can chemically-actuate the grippers. For biological applications, we screened a variety of biochemicals and observed that actuation was also possible with triggers such as L-glutamine, glucose, and L929 media. As compared to caustics and organic solvents that tended to dissolve the polymeric trigger, we observed that the biochemicals attacked the polymer and polymer-Cu interface resulting in cracking and decreased adhesion to the underlying bilayer.

Regardless of the actuation method, we observed that any mechanical property changes (both elastic and plastic) that occurred within the polymer during actuation were important. In order to understand the correlation between elastic mechanical property changes in the polymer and the flexing of the joints, we applied a model using published equations that predict the curvature of multilayer films (Arora W J, Nichol A J, Smith H I, Barbastathis G (2006) Membrane folding to achieve three-dimensional nanostructures: Nanopatterned silicon nitride folded with stressed chromium hinges. *Appl. Phys. Lett.* 88: 0531081-0531083; Nikishkov G P (2003) Curvature estimation for multilayer hinged structures with initial strains. *J. Appl. Phys,* 94: 5333-5336; Bassik N B, Stern G M, Gracias D H (2008) Patterning thin film mechanical properties to drive assembly of complex 3D structures, *Adv. Mater.* in press (DOI: 10.1002/adma.200801759)). The equations captured the effect of elastic deformations in a plane strain condition and were utilized mainly to gain insight into the actuation mechanism. For a given joint length and width composed of elastically isotropic thin films, the product of residual stress and thickness of each film dictated the final flex angle of the joint. Using a KLA-Tencor Flexus FLP2904 wafer curvature thin film stress device, we first determined that 50 nm films of Cr evaporated by our equipment (thickness measured using a quartz crystal microbalance integrated within the evaporator) directly onto silicon wafers had residual stresses of approximately 1 GPa and that 200-250 nm of Cu had tensile residual stresses of approximately 0.04-0.08 GPa, respectively; these values are consistent with those reported in literature (Klokholm E, Berry B S (1968) Intrinsic stress in evaporated metal films. *J. Electrochem. Soc.* 115: 823-826). Taking the literature values for elastic moduli of Cr and Cu films to be 144 GPa (Qi Z Q, Meletis E I (2005) Mechanical and tribological behavior of nanocomposite multilayered Cr/a-C thin films. *Thin Solid Films* 479: 174-181) and 130 GPa (Freund L B, Suresh S (2003) *Thin film materials: stress, defect formation, and surface evolution* (Cambridge University Press, Cambridge, UK)), the model predicted a bend angle of 95°-70° for a Cr/Cu bilayer (with no polymer) composed of a range of Cu thicknesses between 200-250 nm, respectively (FIG. 9). The predicted angles were consistent with experimental observations for joint flexing after complete dissolution of the polymer layer. When the thin film bending model was extended to three layers, accounting for the presence of an untriggered polymer component, the model predicted very slight bending (on the order of a few degrees) when the modulus of the polymer was approximately 0.5 GPa. This matched the observation that grippers with trilayer joints remained flat upon liftoff at room temperature. The model suggested that the elastic modulus of the polymer needed to be decreased below approximately 10 MPa for the joint to flex significantly (FIG. 9). A trilayer joint with a polymer trigger having an elastic modulus reduced to approximately 800 kPa achieved a flex angle that was 95% of that produced by a bare Cr/Cu bilayer. This modulus falls within the range of soft materials, such as silicone dental impression material (~500 kPa) (Jamani K D, Harrington E, Wilson H J (1989) Rigidity of elastomeric impression materials. *J. Oral Rehab.* 16: 241-248). Thus, any process that alters the polymeric trigger to decrease its elastic modulus to within this kPa to MPa range can cause actuation of the gripper. It should be noted that any plastic deformation of the polymer (which also likely occurs during actuation) by biochemical or thermal triggers was beyond the scope of the model.

In addition to characterizing the design, we performed application-oriented experiments to highlight the utility of the microgrippers. Since the grippers were untethered and fabricated with nickel (a ferromagnetic material) phalanges, they could be precisely manipulated using a magnet from distances as far away as ten centimeters. As opposed to tethered grippers, the mobile microgrippers were easily moved through coiled tubes (FIG. 10C). Additionally, multiple microgrippers could be moved simultaneously. However, if they were brought too close, the ferromagnetic grippers attracted each other and became entangled; thus, for precision applications, they were used individually. By enabling remote control of movement and utilizing thermal triggering of gripper closure, it was possible to perform spatio-temporally controlled capture and retrieval of glass beads (FIG. 10D-10I). Shown in FIGS. 10E-10I is a gripper that was remotely manipulated to selectively retrieve a dyed bead among numerous colorless beads in water. The gripper was moved over the bead, and the temperature of the solution was increased to trigger closing. The gripper firmly grasped the bead and was remotely manipulated while carrying the bead within its grasp. This process was highly reproducible, even with smaller grippers.

Since the microgrippers could be actuated in biologically-compatible, aqueous environments, we used them to capture clusters of live L929 fibroblast cells from dense cell masses deposited at the end of 1.5 mm diameter capillary tubes. Shown in FIGS. 11A-11C is a gripper that was remotely guided into a capillary tube and thermally-triggered to grasp a portion of a living cell mass stained with Neutral Red (a red stain that accumulates in lysosomes after diffusing through the cell membrane of viable cells). The microgripper was then guided out of the capillary with the captured cells in its grasp (FIG. 11D-11E). The cells were still viable, as indicated by their red color, and the cluster of cells after retrieval can be seen in FIG. 11F. The experiment was repeated numerous times with LIVE/DEAD® stain to further demonstrate cell viability after thermally-triggered capture (FIG. 11G). After retrieval, we placed cell-loaded grippers into media and incubated for 72 hours; the cells were still viable (FIG. 11H), signifying that the materials used in the fabrication of the grippers and the capture and retrieval processes were not harmful to the cells. The viability of the captured cells after incubation provides evidence that the grippers could be used as biological storage devices until the samples are ready to be analyzed.

in addition to thermally-triggering the grippers, we used biochemical-triggered actuation to capture live cells. We observed that grippers closed to some degree in a variety of biochemicals, including aqueous solutions of glucose, trypsin, and L929 cell media (detailed list in the table in FIG. 12). It is important to note that the time required to close the microgrippers with biochemical triggers was longer than that needed with thermal or caustic/solvent-based actuation. We believe that biochemical actuation occurs as a result of a chemical attack of the polymer-Cu interface, a process that takes longer, and results in decreased adhesion of the polymer. Based on the results from our biochemical screening and the fact we were using L929 cells, we chose to use L929 cell media as a biocompatible trigger. Grippers were placed into centrifuged solutions containing L929 cells and L929 media and then placed into an incubator to sustain the cells. It is important to note that the grippers partially closed at room temperature when exposed to L929 media, but further closed under the incubator conditions used to maintain the cells. After 30 minutes, the grippers closed around cells, and they were imaged after four hours. Rather than imaging the grippers immediately, waiting four hours allowed us to determine if any apoptotic (as opposed to necrotic) cell death had occurred. FIG. 11I features a fluorescent micrograph of a gripper closed around live (green) L929 cells after four hours in L929 media.

To explore the utility of the gripper in microsurgical applications, we performed an in vitro biopsy on a tissue sample from a bovine bladder (FIG. 11J) loaded into a 1.5 mm glass capillary tube. This experiment necessitated using the magnet to rotate the gripper such that the claw phalanges could cut through the connective tissue and extricate the cells. This experiment demonstrated that even though the grippers had nano-microscale actuation joints, they were strong enough to perform an in vitro tissue biopsy.

Also, we magnetically manipulated a microgripper in different regions of whole bovine bladder tissue, including both rough and smooth areas. It was observed that the claw would become adhered and immobile when manipulated across the rough tissue, as the claw phalanges became entangled with the tissue. However, the gripper could eventually be dislodged with continued magnetic manipulation. On smooth tissue, it was observed that the claw could be easily manipulated. FIG. 11K shows a gripper that was blindly manipulated through an orifice in the bladder tissue.

Once closed, the contents of the grippers could be retrieved in a biocompatible manner by mechanical disruption. Beads retrieved from the gripper were not damaged and retrieved cells were viable. After retrieving the microgrippers with captured cells, they were mechanically agitated using a variety of methods (including force applied via Pasteur pipette tip, prying open with 22G syringe tips, and vortexing) to release the cells. Vortexing also provided a way of releasing the cells and leaving the microgripper intact. Vortexing dispersed the cells, making them hard to find and image, but the cells could be centrifuged and collected for further testing. To release captured clumps of cells without dispersing them, we used either a Pasteur pipette or syringe tips to open the grippers; however, this method typically damaged the microgrippers. Ideally, it would be possible to both close and open the grippers under biological conditions in a reversible manner; we have yet to demonstrate this feature with tetherless grippers. Presently, our grippers function only in single-use capture applications, such as those demonstrated (e.g. capture and retrieval of objects and biopsies). For applications such as biopsies, the lack of reusability is not a concern, since the grippers are fabricated en masse and are inexpensive. However, other combinations need to be explored to enhance the functionality of microgrippers by enabling features, such as multi-use, reversible operation and triggering based on more specific biochemical cues. Actuation based on highly-specific biochemical triggers is attractive for autonomous function, and these cues are widely observed in nature, e.g. receptor-ligand binding triggered endocytosis. In the present case, our grippers are actuated by a wide range of biochemicals, and there exists the possibility for falsely-triggered actuation due to a nonspecific response.

It should be noted that the objects, once captured, can be released from the gripper, if the need arises, by a variety of methods, including chemical dissolution and mechanical disruption of the hinges. Once closed, we have also observed that the gripper will start to reopen when heated to higher temperatures (~140° C.). Additionally, since the grippers are lithographically patterned, they can be fabricated in a variety of shapes and sizes, including those with solid or porous faces to enable either retention or size exclusion capture of objects within them.

Regarding size, our closed grippers are approximately 5-20 times larger than mammalian cells; smaller grippers will need to be constructed for single cell capture studies. This decrease in size will require a redesign of the joint to incorporate thin films that experience higher stress (as compared to the particular demonstrated combination of Cu/Cr) that can achieve tighter radii of curvature. Additionally, for smaller grippers, advanced lithographic schemes such as electron beam lithography may be needed to pattern any sub-micron scale features.

In summary, we have developed microgrippers according to an embodiment of the current invention with features widely observed in microscale biological components, namely mobility and mass-actuation based on biologically-benign cues. We envision the use of these mass-producible, mobile grippers in the capture and retrieval of objects from hard to reach places, such as within tubes and capillaries of microfluidic devices, and possibly even in microsurgical procedures. At the present time, internal biopsies are performed through the use of tethered microsurgical tools. It is difficult to manipulate tethered systems around corners and in coiled geometries; hence, we believe our mobile grippers may allow for the development of minimally-invasive microsurgical tools. However, regarding in vivo microsurgical procedures, several challenges arise. Our microgrippers represent an image-guided platform, and techniques such as magnetic resonance imaging or computed tomography will be needed for in vivo guidance. One highlight here is that our microgrippers are metallic; hence, these structures can be easily imaged using magnetic resonance techniques (Gimi B, et al. (2005) Self-assembled three dimensional radio frequency (RF) shielded containers for cell encapsulation. *Biomed. Microdev.* 7: 341-345) and specifically heated using electromagnetic fields (Ye H K, et al. (2007) Remote radio-frequency controlled nanoliter chemistry and chemical delivery on substrates. *Angew. Chem. Int. Edit.* 46: 4991-4994). Another possible complication is that the grippers may become lodged in tissue before reaching the target destination. We have observed remarkably that the grippers can be moved over large distances over certain types of tissue without becoming caught (FIG. 11K). Guidance and actuation on different tissue types, as well as under fluid environments that experience high shear, need to be investigated. Nevertheless, it should be noted that the micro-grippers represent a step towards the development of biocompatible, minimally-invasive, autonomous microtools. Finally, the principles used in the design of the gripper highlight the utility of thin film actuation and self-assembly as attractive paradigms for enabling mass-producible, mass-actuating, and miniaturized machine-based function in human engineered systems, Methods Fabrication of the microgrippers. All microgrippers were constructed as flat 2D structures on silicon substrates using standard photolithographic techniques (Leong T G, Benson B R, Call E K, Gracias D H (2008) Thin film stress-driven self-folding of microstructured containers. *Small* 4: 1605-1609). A sacrificial layer (~5 μm) of poly(vinyl alcohol) [PVA, $M_r$=6000, Polysciences] was first spun onto a silicon wafer and baked for 12 h at 115° C., Then, 50 nm chromium (Cr) and 200-250 nm copper (Cu) thin films were thermally evaporated onto the substrate. Microposit™ SC 1827 [Microchem] was spincoated onto the wafer and patterned with a photomask [Fineline Imaging] containing the phalange features. The photopatternable polymer was developed and the microgripper phalanges electrodeposited with nickel (6 μm) and gold (500 nm) using commercial electrolytic solutions [Technic, Inc.]. The gold capping layer enhanced wet-etch resistance and biocompatibility of the microgrippers. A second photolithographic step patterned the trilayer joints, and the exposed surrounding Cu and Cr seed layers were etched using commercial etchants, APS-100 and CRE-473 [Technic, Inc.], respectively. The open microgrippers were released from the substrate by immersion of the silicon wafer in water, which dissolved the sacrificial PVA layer.

Thermal triggering of the microgrippers. Grippers were typically placed into a dish of water and heated using a hot plate above ~40° C. to trigger the closing of the microgripper. Alternatively, a faster method of heating was performed using a heat gun [Black & Decker], but the temperature was difficult to regulate, leading to the possibility of causing damage to the cells.

Thermally-triggered capture and retrieval of a glass bead: Experimental details of the demonstrations shown in FIG. 4E-I and Movie S2. One dyed and numerous clear ~275 μm glass microspheres [Polysciences] were placed into a glass dish containing water. A microgripper (375 μm diameter when closed) was placed into the dish using a large tipped pipette and guided with a magnet from afar, over to the dark bead. Once the gripper was in place, the dish was heated above ~40° C. using a hot plate to trigger the closing of the microgripper. After the dyed bead was captured, the microgripper was moved away with the magnet. This process was repeated in Movie S2 with ~100 μm glass microspheres [Polysciences] and a smaller microgripper (190 μm when closed).

L929 cell preparation and staining with Neutral Red. Mouse fibroblast cells (L929) [Sigma] were cultured and maintained following standard cell culture protocols. Briefly, the cells were cultured in 75 $cm^2$ culture flask in 85% Minimum Essential Medium Eagles containing L-glutamine and sodium bicarbonate with 10% horse serum and supplemented with MEM non-essential amino acids and sodium pyruvate. The cells were maintained in an incubator set to 37° C. with a water-saturated 5% $CO_2$ atmosphere. The cells were trypsinized and transferred to an Eppendorf tube containing a 1:10 concentration of Neutral Red [Invitrogen] dye (which stains live cells red) in L929 media and allowed to uptake the dye for a period of 45-60 min.

L929 cell preparation and staining with LIVE/DEAD® stain. L929 mouse fibroblast cells [Sigma] were cultured and maintained following standard cell culture protocols. The cells were trypsinized, resuspended in 4 mL of L929 media, and transferred to 15 mL conical tubes and subsequently centrifuged at 1500 rpm for 5 minutes. This resulted in the formation of a dense cell mass. The cells were stained either before or after capture with the LIVE/DEAD® two-color fluorescence stain (Invitrogen). The Calcein AM component stains live cells green and Ethidium homodimer-1 stains dead or damaged cells red.

Thermally-triggered capture of live cells: Experimental details of the demonstration shown in FIGS. 11A-11F. A glass capillary tube approximately 1.5 mm in diameter was plugged at one end with a polydimethylsiloxane stopper and subsequently loaded with the stained cells. The capillary tube with the cells was centrifuged at 500 rpm for 5 min to produce a dense cell mass at the plugged end. The capillary and a released microgripper were then placed into phosphate buffered saline, and the microgripper was remotely guided using a magnet to enter the capillary from the accessible end to approach the cell mass. When the microgripper was next to the cell mass, the solution was heated briefly (less than 1-2 min) on a hot plate and the microgripper closed around the cells. Upon closing, the microgripper containing a sampling of cells was magnetically guided out of the capillary back to the original starting position.

Retrieval of viable cells from the microgripper. After retrieving microgrippers that had captured cells, the grippers were mechanically disrupted by applying force via Pasteur pipette tip or prying open with 22G syringe tips. The grippers and cells were then stained with LIVE/DEAD® stain and imaged using fluorescent microscopy.

Thermally-triggered capture of cells for culture: Experimental details of the demonstration shown in FIG. 11H. Centrifuged L929 cells were loaded into a vertical 1.5 mm diameter glass capillary containing L929 cell media and allowed to settle due to gravity as a large cell mass. The loaded capillary was placed into a Petri dish filled with L929 cell media and a microgripper. The microgripper was magnetically manipulated into the capillary and captured a clump of the cells upon heating. This process was easily performed and successfully repeated over two dozen times. Upon retrieval from the capillary, the microgripper loaded with captured fibroblast cells was placed into new media and incubated for 72 hours. LIVE/DEAD® stain was applied to verify the viability of the cells.

Biochemical-triggered capture of cells: Experimental details of the demonstration shown in FIG. 11I. Two separate tests where devised to capture live cells using biochemically-induced actuation. In the first test, L929 cells were centrifuged and half of the supernatant was added to a small plastic Petri dish containing 5 mL of L929 media. Two grippers were then added to the Petri dish and the dish was placed into an incubator at 37° C. In the second test, cells where centrifuged in L929 media and two grippers were added directly to the centrifuge tube, where they settled into the cell mass. The test tube was incubated at 37° C. The grippers were separated from the cells using a magnet and imaged after 4 hours.

In vitro biopsy of a bovine bladder: Experimental details of the demonstration shown in FIG. 11J. A core sample of bovine bladder tissue [Innovative Research] was taken with a 1.5 mm diameter glass capillary, thus plugging the end of the capillary tube. The experiment was performed in a manner similar to the cell capture experiments. A microgripper was guided into the capillary and heated to close around a clump of the bladder tissue. In order to retrieve the microgripper with a sample, the magnet used for guidance was rotated to spin the microgripper allowing the nail phalanges to cut the connective tissue, extricate the cell mass, and become free of the tissue. After cutting through, the microgripper was guided out of the capillary and imaged with the captured bladder cells.

Manipulation of a gripper in bovine bladder tissue (FIG. 11K). Bovine bladder tissue was placed into a large Petri dish filled with phosphate buffer saline. A gripper was placed into the solution on the bladder tissue. We manipulated the gripper through an opening in the tissue where blind manipulation was required.

EXAMPLE 4

In this example according to an embodiment of the current invention, we demonstrate the concept of single use, chemically triggered, reversible tools in the form of mobile grippers that can be used to manipulate micro-objects. Both the closing and opening of the mobile grippers are triggered by chemicals, namely acetic acid ($CH_3COOH$) and hydrogen peroxide ($H_2O_2$), respectively. The grippers close and open en masse based on chemical etching, which results in mechanical property changes within trilayer joints patterned within the gripper, and no external power is needed for operation. We describe the actuation of the gripper using a multilayer thin film model and demonstrate utility of the gripper by picking-and-placing 200 μm diameter tubes and beads. Our pick-and-place microgripper is a step toward the development of functional Micro Chemo-Mechanical Systems (MCMS), which are actuated by chemistry as opposed to electricity [as in Micro Electro-Mechanical Systems (MEMS)].

A dominant paradigm in engineering is to fabricate Microsystems that are triggered by electrical, thermal, or pneumatic signals ((a) Cecil, J.; Vasquez, D.; Powell, D. Int. J. Prod. Res. 2005, 43, 819-828. (b) Andersen, K. N.; Carlson, K.; Petersen, D. F.; Molhave, K.; Eichhorn, V.; Fatikow, S.; Boggild, P. Microelectron. Eng. 2008, 85 (5-6), 1128-1130. (c) Buckley, P. R.; McKinley, G. H.; Wilson, T. S.; Small, W.; Benett, W. J.; Bearinger, J. P.; McElfresh, M. W.; Maitland, D. J. IEEE Trans. on Biomed. Eng. 2006, 53 (10), 2075-2083. (d) Shahinpoor, M.; Bar-Cohen, Y.; Simpson, J. O.; Smith, J. Smart Mater. Struct. 1998, 7 (6), R15-R30. (e) Lu, Y. W.; Kim, C. J. Appl. Phys. Lett. 2006, 89 (16), 164101-164103). While actuation by these signals has achieved a high degree of control and precision in certain applications, several limitations exist. Electrically actuated devices, for example, typically need wiring, thereby limiting the miniaturization, maneuverability, and the ability to trigger many devices simultaneously when they are spatially separated. In contrast, biological machinery widely utilizes chemically actuated triggers which enable autonomous function and high selectivity. A classic example is the antibody-antigen binding that triggers macrophage function (Kuby, J. *Immunology*; W.H. Freeman & Co: 1998). As compared to electrical feedback loops, coupled chemical reactions can enable a high degree of autonomous function as well as multistep behavior (Epstein, I. R.; Pojman, J. A. An Introduction to Nonlinear Chemical Dynamics: Oscillations, WaVes, Patterns, and Chaos; Oxford University Press: 1998).

Figure 13A:
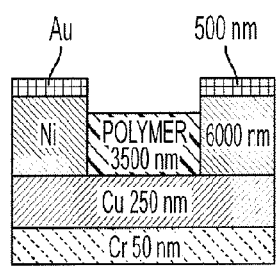
FIG. 13a shows a schematic diagram of a trilayer hinge joint between two Au coated Ni phalanges according to an embodiment of the current invention. Optical microscopy image of (FIG. 13b) a single microgripper and (FIG. 13c) many microgrippers in water.
Figure 13B:
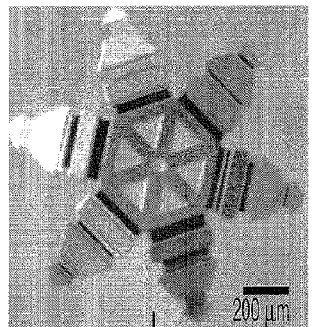
(FIG. 13d) Schematic diagram of the microgripper closing when acetic acid dissolves the polymer layer within the hinge. Optical microscopy image of (FIG. 13e) a single microgripper and (FIG. 13f) many microgrippers closing on addition of acetic acid (inset shows the view from the bottom of a closed microgripper).
(FIG. 13g) Schematic diagram of the microgripper opening when $H_2O_2$ dissolves the Cu layer within the hinge. Optical microscopy image of (FIG. 13h) a single microgripper and (FIG. 13i) many microgrippers opening upon addition of $H_2O_2$.
Figure 13C:
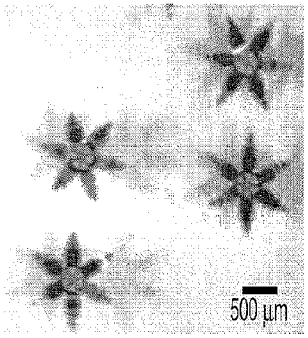
Figure 13D:
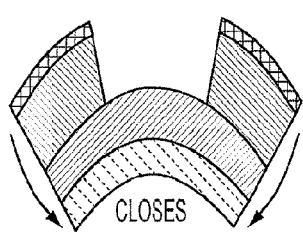
Figure 13E:
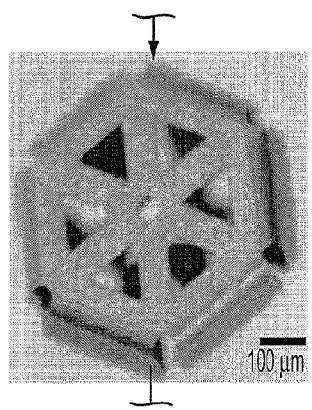
Figure 13F:
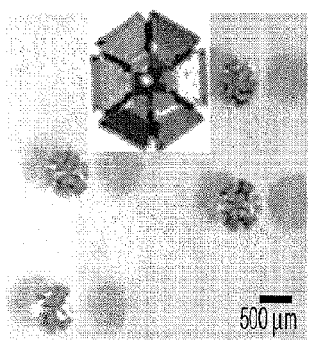
Figure 13G:
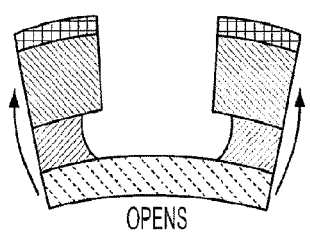
Figure 13H:
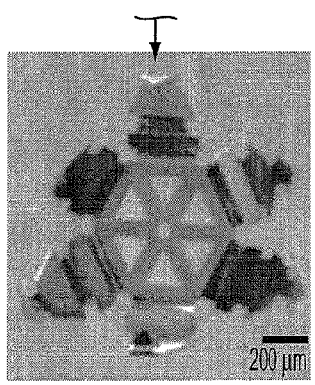
Figure 13I:
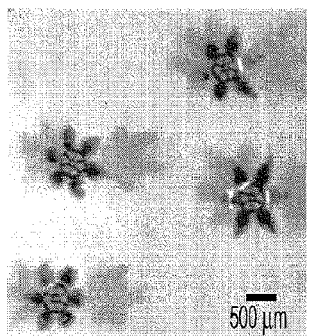

We fabricated three-dimensional (3D) microgrippers in a highly parallel and cost-effective manner using two layers of conventional photolithography according to an embodiment of the current invention. The grippers were shaped like hands and have a gold (Au, 500 nm thick) coated nickel (Ni, 6 μm thick) palm and phalanges separated by trilayer joints. The smallest grippers had a dimension of 700 μm when open and ~200 μm when closed. Since Ni is ferromagnetic, the grippers could be moved with a magnet from distances as far away as several centimeters. The Au coating improved the etch selectivity of the underlying Ni layer. The trilayer joints were composed of films of the following thickness; 50 nm chromium (Cr), 250 nm copper (Cu), and 3.5 μm of a commercial novolac photopatternable polymeric resin (FIG. 13a). The grippers were released from the Si substrate on which they were fabricated by dissolving a water soluble polyvinyl alcohol (PVA) sacrificial layer.

The operation of the gripper was controlled by a Cr/Cu metallic bilayer with another layer of polymer acting as the trigger (FIG. 13). Stressed bilayers have been seen to release residual stress by bending spontaneously upon release from substrates (Prinz, V. Ya.; Seleznev, V. A.; Samoylov, V. A.; Gutakovsky, A. K. Microelectron. Eng. 1996, 30, 439-442). However, in our case the grippers remained flat when released from the substrate, since the stiff polymer prevented the spontaneous bending of the stressed bilayer within the joints (FIG. 13a-13c). When $CH_3COOH$ was added to the water, the polymer dissolved (Chavez, K. L.; Hess, D. W. *J. Electrochem. Soc.* 2003, 150 (4), G284-0291) causing the joints to bend and the grippers to close (FIG. 13d-13f). The gripper then remained closed and could be moved around without reopening. Subsequently, when $H_2O_2$ was added to the aqueous acetic acid solution (1-5% w/w), the Cu layer dissolved ((a) Du, T.; Vijayakumar, A.; Desai, V. Electrochim. Acta 2004, 49 (25), 4505-4512. (b) Chavez, K. L.; Hess, D. W. J. Electrochem. Soc. 2001, 148 (11), G640-G643), causing the Cr joint to straighten out and the gripper to reopen (FIG. 13g-13i).

Figure 14A:
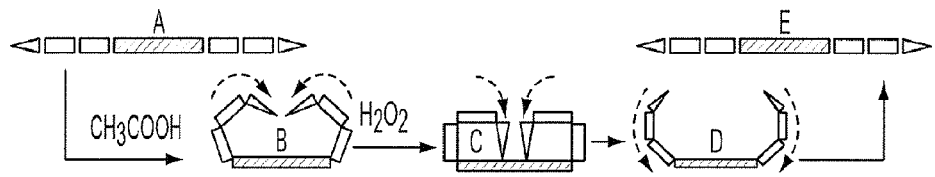
FIG. 14a is a schematic diagram and corresponding optical microscopy images (FIG. 14b) showing the different steps during closing and opening of the gripper. The thin film multilayer model predicts a change in the hinge angle upon (FIG. 14c) removal of the polymer causing the gripper to close and (FIG. 14d) removal of the copper causing the gripper to first tighten and then open.
Figure 14B:
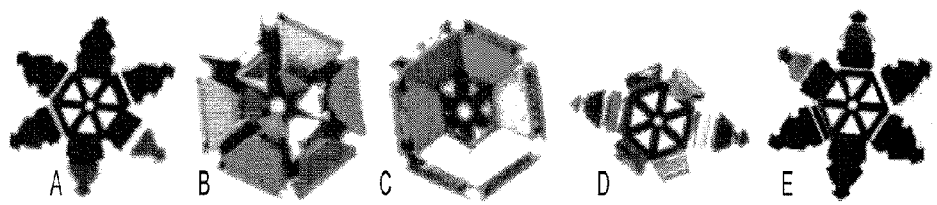
(FIG. 14e) Schematic diagram of chemo-mechanical actuation.
Figure 14C:
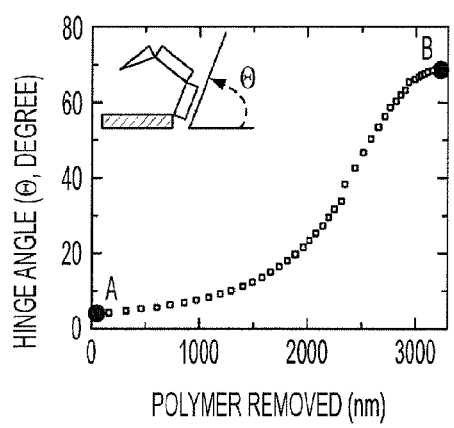
Figure 14D:
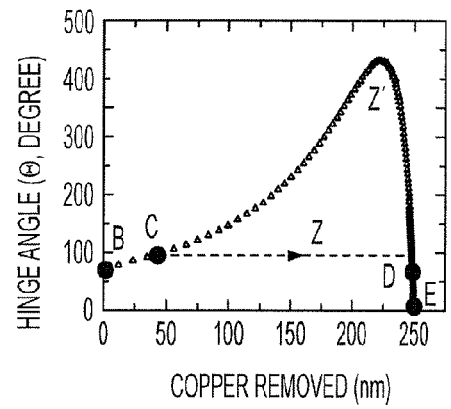
Figure 14E:

To understand the mechanical response of the joints, we modeled the trilayer joint using a multilayer thin film model (Nikishkov, G. P. *J. Appl. Phys.* 2003, 94 (8), 5333-5336) (FIG. 14). When the polymer is present, the joints remain almost flat (FIGS. 14a, 14b; state A), which agrees with the small hinge angle) (4°) predicted by the model (FIG. 14c, state A). When the polymer is dissolved, the grippers close (FIGS. 14a, 14b; state B); the model predicts a hinge angle of ~68° after complete removal of polymer (FIG. 14c; state B). Hence, $CH_3COOH$ causes the gripper to move from state A to state B (FIG. 14e).

The opening mechanism is, however, more complicated. When $H_2O_2$ is added to the aqueous $CH_3COOH$ solution, the Cu starts to dissolve. Initially, we observed that the grippers tighten (FIGS. 14a, 14b; state C); this behavior is validated by the model (FIG. 14d; state C) which actually predicts an increase in hinge angle (path Z', FIG. 14d). In an unpatterned film, this large angle is equivalent to bending in multiple turns. However, since the bending of the joints in the gripper is restricted as a consequence of the phalanges pushing into each other, the gripper merely tightens. When the Cu is completely dissolved however, a bare Cr film remains which causes the grippers to open (FIGS. 14a, 14b; state D) and eventually flatten out completely (FIGS. 14a, 14b; state E); this behavior is in agreement with the model (FIG. 14d; state D,E). Hence, the $H_2O_2$ causes the grippers to transition from state B to E, along path Z.

Figure 15A:
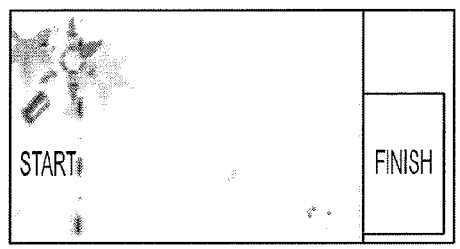
FIGS. 15a-15d show video microscopy snapshots showing pick-and-place of a 200 μm diameter gold tube.
Figure 15B:
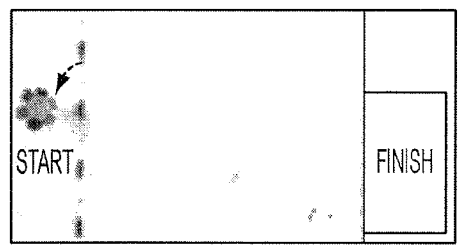
Figure 15C:
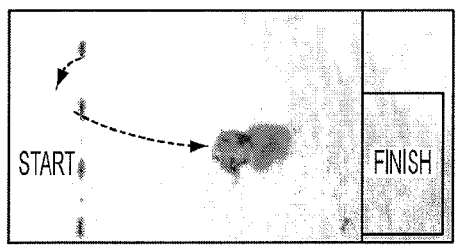
Figure 15D:
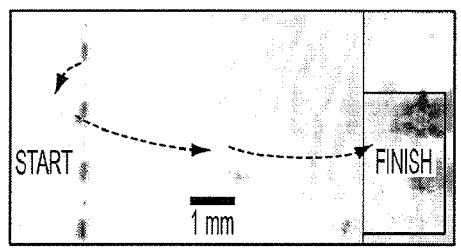
Figure 15E:
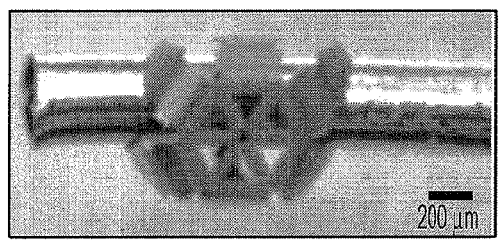
(FIG. 15e) Optical microscopy zoom image of microgripper holding on to a long 200 μm diameter gold tube.
Figure 15F:
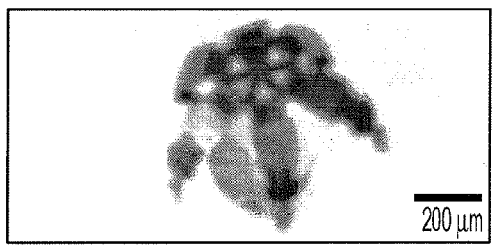
(FIG. 15f) Optical microscopy image showing a smaller microgripper holding onto a 200 μm diameter glass bead.

Since the gripper could be both closed and opened by chemicals, it was used to accomplish the pick-and-place function. Pick-and-place (Lee, M. H.; Rowland, J. J. *Intelligent Assembly Systems*; World Scientific Publishing Co., Inc.: 1995) is ubiquitous in human engineering, specifically enabling high throughput, assembly line manufacturing. The function involves either automated or operator assisted picking up of an object at one location and placing it at another specified location. Briefly, this engineering task was accomplished by moving the gripper with a magnet to place it on top of the object (with dimensions as small as 200 µm). The gripper closing was triggered by the addition of $CH_3COOH$. The gripper closed and securely held the object which could then be moved to a specified location. When the gripper was at this location, $H_2O_2$ was added to the solution to cause the gripper to open and release its contents (FIG. 15a15-d). Experiments such as these were repeated several times with a range of objects including glass beads, wires, and tubes.

In conclusion, we have described reversible, chemo-mechanically triggered microgrippers that were used to pick and place objects. Such tools are not conventionally available, and we anticipate their utility in laboratory-on-a-chip applications, reconfigurable microfluidic systems, and micromanufacturing. Here, the chemicals used to trigger our microgrippers are not compatible with living organisms; actuation under biological conditions for biopsy applications is described in some examples above. This communication represents a convincing proof-of-concept of an MCMS pick-and-place microgripper, and other material combinations of the trilayer hinges (such as the inclusion of lithographically patterned gels and smart polymers as triggers) ((a) Guan, J. J.; He, H. Y.; Hansford, D. J.; Lee, L. J. *J. Phys. Chem. B* 2005, 109 (49), 23134-23137. (b) Bassik, N.; Abebe, B.; Gracias, D. H. *Langmuir* 2008, 24 (21), 12158-12163) need to be explored to enable multiuse reversible operation and actuation with other chemicals.

In summary, we have described a tetherless gripper that can be actuated to capture and retrieve objects. We envision the use of the mass producible mobile gripper in the capture and retrieval of objects from hard to reach places, such as within tubes and capillaries of microfluidic devices and in vitro laboratories-on-chips, and possibly even in minimally invasive microsurgical procedures. The principles used in the design of the gripper also point to the utility of thin film actuation, self-assembly, and biomimicry as attractive paradigms for enabling remote and autonomous control of miniaturized machine-based function in human engineered systems.

In the above, a few specific examples of structures were shown in detail to help explain some concepts of the current invention. The invention is not limited to these particular examples. The term gripper or microgripper is intended to have broad meanings. Embodiments of the invention are intended to include gripper structures that broadly have structures that can be moved to grip onto an object. In addition, a wide range of devices and structures are intended to be included within the general concepts of the current invention. For example, other embodiments can include, but are not limited to, locomotors (walking devices), cutters, suturing devices, and surgical devices, for example. Furthermore, although structures can be made that are smaller than about 10 mm, other embodiments include devices that are larger than 10 mm.

In describing embodiments of the invention, specific terminology is employed for the sake of clarity. However, the invention is not intended to be limited to the specific terminology so selected. The above-described embodiments of the invention may be modified or varied, without departing from the invention, as appreciated by those skilled in the art in light of the above teachings. it is therefore to be understood that, within the scope of the claims and their equivalents, the invention may be practiced otherwise than as specifically described.

We claim:

1. A lithographically structured device, comprising:
    an actuation layer; and
    a control layer operatively connected to said actuation layer,
    wherein said actuation layer is constructed of a material and with a structure such that it stores torsional energy upon being constructed,
    wherein said control layer is constructed to maintain said actuation layer substantially in a first configuration in a local environmental condition and is responsive to a change in said local environmental condition such that it permits a release of stored torsional energy to cause a change in a structural configuration of said lithographically structured device to a second configuration, and
    wherein said lithographically structured device has a maximum dimension that is less than about 1 mm when it is in said second configuration.

2. A lithographically structured device according to claim 1, wherein said control layer comprises a first structural segment, a second structural segment and a joint therebetween, and wherein said first and second structural segments of said control layer are caused to rotate with respect to said joint by said release of stored torsional energy from said actuation layer after said change in said local environmental condition.

3. A lithographically structured device according to claim 2, wherein said joint comprises a material that changes its stiffness in response to said change in said local environmental condition.

4. A lithographically structured device according to claim 3, wherein said change in said local environmental condition is a change in a local temperature to which said joint is subjected.

5. A lithographically structured device according to claim 4, wherein said change in a local temperature to which said joint is subjected is less than about 20° C.

6. A lithographically structured device according to claim 4, wherein said change in a local temperature to which said joint is subjected is an increase in temperature from about a standard room temperature to a temperature less than about 40° C.

7. A lithographically structured device according to claim 2, wherein said joint comprises a sacrificial material that is caused to be removed in response to said change in said local environmental condition.

8. A lithographically structured device according to claim 7, wherein said change in said local environmental condition is a chemical change that at least one of etches or dissolves at least a portion of said sacrificial material of said joint.

9. A lithographically structured device according to claim 1, wherein said actuation layer comprises a bi-metallic layer.

10. A lithographically structured device according to claim 9, wherein said bi-metallic layer of said actuation layer comprises a layer of Cr.

11. A lithographically structured device according to claim 10, wherein said bi-metallic layer of said actuation layer comprises a layer of Cu.

12. A lithographically structured device according to claim 2, wherein said joint comprises a polymer.

13. A lithographically structured device according to claim 2, wherein at least one of said first and second structural segments comprises a magnetic material.

14. A lithographically structured device according to claim 1, wherein said control layer comprises a plurality of structural segments, and a plurality of joints arranged in a pattern selected to form a predetermined three-dimensional structure in said second configuration by folding said plurality of structural segments by said release of stored torsional energy from said actuation layer after said change in said local environmental condition.

15. A lithographically structured device according to claim 14, wherein said pattern of structural segments and said plurality of joints are arranged in a substantially flat, cruciform pattern in said first configuration and said predetermined three-dimensional structure in said second configuration is substantially a cube-shaped structure.

16. A lithographically structured device according to claim 14, wherein said pattern of structural segments and said plurality of joints are arranged in a substantially flat, open gripper pattern in said first configuration and said predetermined three-dimensional structure in said second configuration is a closed gripper structure.

17. A lithographically structured device according to claim 1, wherein said structural segments define pores there through to permit fluid to flow through said pores.

18. A lithographically structured device according to claim 1, further comprising a layer of biocompatible material formed on at least a portion of at least one of said actuation layer or said control layer.

19. A lithographically structured device according to claim 1, further comprising a functionalization layer formed on at least a portion of at least one of said actuation layer or said control layer.

20. A lithographically structured device according to claim 1, wherein said lithographically structured device is configured to encapsulate or grip an object upon changing to said second configuration.

21. A lithographically structured device according to claim 20, wherein said change in said local environmental condition is a biocompatible change that does not damage a biological environment of said lithographically structured device upon changing to said second configuration.

* * * * *